(12) United States Patent
Anac et al.

(10) Patent No.: US 10,234,477 B2
(45) Date of Patent: Mar. 19, 2019

(54) COMPOSITE VIBRATORY IN-PLANE ACCELEROMETER

(71) Applicant: Lumedyne Technologies Incorporated, San Diego, CA (US)

(72) Inventors: Ozan Anac, Oakland, CA (US); Xiaojun Huang, San Diego, CA (US)

(73) Assignee: Google LLC, Mountain View, CA (US)

( * ) Notice: Subject to any disclaimer, the term of this patent is extended or adjusted under 35 U.S.C. 154(b) by 311 days.

(21) Appl. No.: 15/275,188

(22) Filed: Sep. 23, 2016

(65) Prior Publication Data

US 2018/0031601 A1  Feb. 1, 2018

Related U.S. Application Data

(60) Provisional application No. 62/367,624, filed on Jul. 27, 2016.

(51) Int. Cl.
*G01P 15/08* (2006.01)
*G01P 15/125* (2006.01)
(Continued)

(52) U.S. Cl.
CPC ........ *G01P 15/097* (2013.01); *G01C 19/5726* (2013.01); *G01C 19/5776* (2013.01); *G01P 15/125* (2013.01); *B81B 2201/0235* (2013.01); *B81B 2203/051* (2013.01); *G01P 15/14* (2013.01); *G01P 2015/0808* (2013.01); *G01P 2015/0814* (2013.01)

(58) Field of Classification Search
CPC ............ G01C 19/5762; G01C 19/5747; G01C 19/5726; G01C 19/56; G01P 2015/0811; G01P 2015/0814; G01P 15/14; G01P 15/125; G01P 15/11
See application file for complete search history.

(56) References Cited

U.S. PATENT DOCUMENTS 3,925,642 A   12/1975  Roantree et al.
4,930,351 A    6/1990  Macy et al.
(Continued)

FOREIGN PATENT DOCUMENTS

CN   1164147    11/1997
CN   1783725     6/2006
(Continued)

OTHER PUBLICATIONS

Alshehri et al., "Experimental Evaluation of a Two Degree of Freedom Capacitive MEMS Sensor for Velocity Measurements", *Procedia Engineering*, vol. 25, 2011, pp. 619-622, ISSN 1877-7058.
(Continued)

*Primary Examiner* — Lisa Caputo
*Assistant Examiner* — Herbert K Roberts
(74) *Attorney, Agent, or Firm* — Colby Nipper

(57) ABSTRACT

Systems and methods are described herein for detecting and measuring inertial parameters, such as acceleration. In particular, the systems and methods relate to vibratory inertial sensors implementing time-domain sensing techniques. Within a composite mass sensor system, a sense mass may oscillate at a frequency different from its actuation frequency, allowing flexibility when integrating the sensor into drive systems without sacrificing sensitivity.

27 Claims, 16 Drawing Sheets

(51) Int. Cl.
  *G01P 15/097* (2006.01)
  *G01C 19/5726* (2012.01)
  *G01C 19/5776* (2012.01)
  *G01P 15/14* (2013.01)
  *G01P 15/11* (2006.01)

(56) References Cited

U.S. PATENT DOCUMENTS

| | | |
|---|---|---|
| 5,561,400 A | 10/1996 | Iguchi et al. |
| 5,572,057 A | 11/1996 | Yamamoto et al. |
| 5,635,638 A | 6/1997 | Geen |
| 5,703,292 A | 12/1997 | Ward |
| 5,747,690 A | 5/1998 | Park |
| 5,894,282 A | 4/1999 | Betts et al. |
| 5,955,668 A | 9/1999 | Hsu et al. |
| 5,992,233 A * | 11/1999 | Clark ............... G01C 19/5719 361/280 |
| 5,996,411 A | 12/1999 | Leonardson et al. |
| 6,044,707 A | 4/2000 | Kato |
| 6,067,858 A | 5/2000 | Clark et al. |
| 6,109,114 A | 8/2000 | Hartley et al. |
| 6,122,962 A | 9/2000 | Yoshino et al. |
| 6,158,280 A | 12/2000 | Nonomura et al. |
| 6,248,610 B1 | 6/2001 | Leonardson et al. |
| 6,250,156 B1 | 6/2001 | Seshia et al. |
| 6,259,999 B1 | 7/2001 | Pantle |
| 6,393,913 B1 * | 5/2002 | Dyck ............... G01P 15/0802 333/186 |
| 6,422,076 B1 | 7/2002 | Prokofiev et al. |
| 6,526,826 B2 | 3/2003 | Kurachi et al. |
| 6,584,864 B2 * | 7/2003 | Greenwood ............ G01L 1/183 73/514.29 |
| 6,629,448 B1 | 10/2003 | Cvancara |
| 6,629,460 B2 | 10/2003 | Challoner |
| 6,679,995 B1 | 1/2004 | Banjac et al. |
| 6,715,353 B2 | 4/2004 | Johnson |
| 6,725,719 B2 | 4/2004 | Cardarelli |
| 6,767,758 B1 | 7/2004 | Geen |
| 6,796,178 B2 | 9/2004 | Jeong et al. |
| 6,859,751 B2 | 2/2005 | Cardarelli |
| 6,955,086 B2 | 10/2005 | Yoshikawa et al. |
| 6,966,224 B2 | 11/2005 | Yan et al. |
| 7,088,030 B2 | 8/2006 | Hsieh et al. |
| 7,107,841 B2 | 9/2006 | Mori |
| 7,119,555 B2 | 10/2006 | Takekawa et al. |
| 7,302,848 B2 | 12/2007 | Kourepenis et al. |
| 7,377,167 B2 * | 5/2008 | Acar ............... G01C 19/5719 73/504.12 |
| 7,444,868 B2 | 11/2008 | Johnson |
| 7,481,110 B2 | 1/2009 | Handrich et al. |
| 7,505,865 B2 | 3/2009 | Ohkubo et al. |
| 7,836,765 B2 | 11/2010 | Challoner et al. |
| 7,997,137 B2 | 8/2011 | Lee et al. |
| 8,061,201 B2 | 11/2011 | Ayazi et al. |
| 8,141,426 B2 | 3/2012 | Ikeuchi et al. |
| 8,220,328 B2 * | 7/2012 | Rudolf ............... G01C 19/5726 702/141 |
| 8,375,791 B2 | 2/2013 | Huang |
| 8,378,756 B2 | 2/2013 | Huang et al. |
| 8,427,249 B1 | 4/2013 | Swanson et al. |
| 8,453,504 B1 | 6/2013 | Mao |
| 8,474,316 B2 | 7/2013 | Blomqvist |
| 8,527,228 B2 | 9/2013 | Panagas |
| 8,650,955 B2 | 2/2014 | Swanson et al. |
| 8,833,162 B2 | 9/2014 | Seeger et al. |
| 8,875,576 B2 | 11/2014 | Swanson et al. |
| 8,952,838 B2 | 2/2015 | Waters et al. |
| 8,981,834 B2 | 3/2015 | Spinella et al. |
| 8,991,250 B2 | 3/2015 | Waters et al. |
| 9,128,496 B2 * | 9/2015 | Waters ............... G01P 15/097 |
| 9,157,814 B2 | 10/2015 | Swanson et al. |
| 9,170,107 B2 | 10/2015 | Anac et al. |
| 9,194,704 B2 | 11/2015 | Lin et al. |
| 9,246,017 B2 | 1/2016 | van der Heide et al. |
| 9,274,136 B2 | 3/2016 | Trusov et al. |
| 9,278,846 B2 | 3/2016 | Acar |
| 9,423,254 B2 | 8/2016 | Waters et al. |
| 9,618,533 B2 | 4/2017 | Waters et al. |
| 9,645,166 B2 | 5/2017 | Waters et al. |
| 9,910,061 B2 | 3/2018 | Waters et al. |
| 9,910,062 B2 | 3/2018 | Waters et al. |
| 9,989,553 B2 | 6/2018 | Waters et al. |
| 2001/0022107 A1 | 9/2001 | Kato et al. |
| 2001/0029784 A1 | 10/2001 | Kurachi et al. |
| 2001/0039834 A1 | 11/2001 | Hsu |
| 2001/0044165 A1 | 11/2001 | Lee et al. |
| 2002/0000124 A1 | 1/2002 | Sakai |
| 2002/0005976 A1 | 1/2002 | Behin et al. |
| 2002/0020219 A1 | 2/2002 | Deroo et al. |
| 2002/0093908 A1 | 7/2002 | Yeap |
| 2002/0158293 A1 | 10/2002 | Lee et al. |
| 2002/0164833 A1 | 11/2002 | Cho et al. |
| 2003/0084722 A1 * | 5/2003 | Kim ............... G01C 19/5762 73/504.08 |
| 2003/0159510 A1 * | 8/2003 | Stewart ............... G01C 19/5705 73/504.12 |
| 2003/0173981 A1 | 9/2003 | Fasen et al. |
| 2004/0211258 A1 | 10/2004 | Geen |
| 2005/0031140 A1 | 2/2005 | Browning |
| 2005/0091006 A1 | 4/2005 | Rober |
| 2005/0132804 A1 | 6/2005 | Park et al. |
| 2006/0074338 A1 | 4/2006 | Greenwald et al. |
| 2006/0079191 A1 | 4/2006 | Parssinen et al. |
| 2006/0162450 A1 | 7/2006 | Harada et al. |
| 2006/0201250 A1 | 9/2006 | Kourepenis et al. |
| 2006/0222107 A1 | 10/2006 | Neubauer et al. |
| 2006/0284514 A1 | 12/2006 | Ko et al. |
| 2007/0032748 A1 | 2/2007 | McNeil et al. |
| 2007/0062282 A1 | 3/2007 | Akashi et al. |
| 2007/0163324 A1 | 7/2007 | McMahan et al. |
| 2007/0194857 A1 | 8/2007 | Schwarzelbach |
| 2007/0210951 A1 | 9/2007 | Yamaji |
| 2007/0214883 A1 | 9/2007 | Durante et al. |
| 2008/0000296 A1 | 1/2008 | Johnson |
| 2008/0275664 A1 | 11/2008 | Schmid et al. |
| 2009/0064780 A1 | 3/2009 | Coronato et al. |
| 2009/0183570 A1 | 7/2009 | Acar et al. |
| 2010/0071467 A1 | 3/2010 | Nasiri et al. |
| 2010/0107758 A1 | 5/2010 | Kandori et al. |
| 2010/0107759 A1 | 5/2010 | Kato |
| 2010/0117167 A1 | 5/2010 | Yokura et al. |
| 2010/0288047 A1 | 11/2010 | Takagi |
| 2010/0319451 A1 | 12/2010 | Trusov et al. |
| 2010/0326191 A1 | 12/2010 | Foster et al. |
| 2011/0004444 A1 | 1/2011 | Farrow et al. |
| 2011/0016973 A1 | 1/2011 | Hamatani et al. |
| 2011/0041601 A1 | 2/2011 | Hsu et al. |
| 2011/0056750 A1 | 3/2011 | Lucon |
| 2011/0138913 A1 | 6/2011 | Je |
| 2011/0167891 A1 | 7/2011 | Geen |
| 2011/0197674 A1 * | 8/2011 | Prandi ............... G01C 19/5726 73/504.12 |
| 2012/0061172 A1 | 3/2012 | Yacine |
| 2012/0065524 A1 | 3/2012 | Morren et al. |
| 2012/0096942 A1 * | 4/2012 | Hayashi ............... G01C 19/56 73/504.12 |
| 2012/0096943 A1 | 4/2012 | Potasek et al. |
| 2012/0132002 A1 | 5/2012 | Dube et al. |
| 2012/0272711 A1 | 11/2012 | Supino et al. |
| 2012/0272732 A1 | 11/2012 | Leverrier |
| 2012/0279300 A1 | 11/2012 | Walther |
| 2012/0297873 A1 | 11/2012 | Zou et al. |
| 2012/0326700 A1 | 12/2012 | Swanson et al. |
| 2013/0061675 A1 | 3/2013 | Kim et al. |
| 2013/0104622 A1 | 5/2013 | Swanson et al. |
| 2013/0104656 A1 | 5/2013 | Smith |
| 2013/0111990 A1 | 5/2013 | Wang et al. |
| 2013/0180333 A1 | 7/2013 | Swanson et al. |
| 2013/0192363 A1 * | 8/2013 | Loreck ............... G01C 19/574 73/504.12 |
| 2013/0218504 A1 | 8/2013 | Fall et al. |
| 2013/0239679 A1 | 9/2013 | Kornilovich |
| 2013/0247669 A1 | 9/2013 | Swanson et al. |

(56) References Cited

U.S. PATENT DOCUMENTS

| | | |
|---|---|---|
| 2013/0249615 A1 | 9/2013 | Lai et al. |
| 2013/0283908 A1 | 10/2013 | Geen et al. |
| 2013/0298670 A1 | 11/2013 | Tsugai et al. |
| 2013/0298675 A1* | 11/2013 | Thiruvenkatanathan ........ G01C 19/5726 73/504.16 |
| 2014/0007681 A1 | 1/2014 | Lin |
| 2014/0047918 A1 | 2/2014 | Swanson et al. |
| 2014/0055124 A1* | 2/2014 | Kim .......... G01R 19/04 324/103 P |
| 2014/0060184 A1 | 3/2014 | Walther |
| 2014/0069188 A1 | 3/2014 | Waters et al. |
| 2014/0083190 A1* | 3/2014 | Kaack ........ G01P 15/125 73/514.14 |
| 2014/0116134 A1 | 5/2014 | Classen |
| 2014/0144230 A1 | 5/2014 | Magnoni et al. |
| 2014/0144232 A1 | 5/2014 | Lin et al. |
| 2014/0208823 A1 | 7/2014 | Trusov et al. |
| 2014/0260508 A1 | 9/2014 | Dar et al. |
| 2014/0260608 A1 | 9/2014 | Lin et al. |
| 2014/0300425 A1 | 10/2014 | Cazzaniga et al. |
| 2014/0305213 A1 | 10/2014 | Swanson et al. |
| 2014/0361348 A1 | 12/2014 | Yoneoka et al. |
| 2015/0046737 A1 | 2/2015 | Hattori et al. |
| 2015/0114117 A1* | 4/2015 | Nakagawa ........ G01C 19/5607 73/504.16 |
| 2015/0211853 A1 | 7/2015 | Anac et al. |
| 2015/0377622 A1 | 12/2015 | Waters et al. |
| 2015/0377623 A1 | 12/2015 | Waters et al. |
| 2015/0377916 A1 | 12/2015 | Waters et al. |
| 2015/0377917 A1 | 12/2015 | Waters et al. |
| 2015/0377918 A1 | 12/2015 | Waters et al. |
| 2016/0123735 A1* | 5/2016 | Gregory .......... G01C 19/5684 73/504.13 |
| 2016/0126890 A1 | 5/2016 | Swanson et al. |
| 2016/0299873 A1* | 10/2016 | Tally .............. G06F 17/18 |
| 2016/0332872 A1 | 11/2016 | Iihola et al. |
| 2016/0341758 A1 | 11/2016 | Waters et al. |
| 2016/0341761 A1 | 11/2016 | Waters et al. |
| 2016/0341762 A1 | 11/2016 | Waters et al. |
| 2017/0003314 A1 | 1/2017 | Waters et al. |
| 2017/0122974 A1* | 5/2017 | Lin .............. G01P 15/125 |
| 2018/0031602 A1 | 2/2018 | Huang et al. |
| 2018/0031603 A1 | 2/2018 | Huang et al. |
| 2018/0135985 A1* | 5/2018 | Song ............ B81B 7/02 |
| 2018/0299269 A1 | 10/2018 | Anac et al. |

FOREIGN PATENT DOCUMENTS

| | | |
|---|---|---|
| CN | 102449433 | 5/2012 |
| CN | 107636473 | 1/2018 |
| EP | 1083430 | 3/2001 |
| EP | 1172657 A1 | 1/2002 |
| EP | 2259019 | 12/2010 |
| GB | 947310 | 1/1964 |
| GB | 2529277 | 2/2016 |
| JP | 02119314 | 5/1990 |
| JP | 2001135039 | 5/2001 |
| JP | 2006304035 | 11/2006 |
| JP | 2012242286 | 12/2012 |
| TW | 594016 | 6/2004 |
| TW | 200807887 | 2/2008 |
| TW | I305578 | 5/2008 |
| TW | I471567 | 1/2012 |
| TW | 201346263 | 11/2013 |
| TW | I495848 | 8/2015 |
| TW | I497078 | 8/2015 |
| WO | 0005552 | 2/2000 |
| WO | 0169266 | 9/2001 |
| WO | 2006039560 | 4/2006 |
| WO | WO 2012/037538 | 3/2012 |
| WO | 2014149085 | 9/2014 |
| WO | 2015200850 | 12/2015 |
| WO | 2016187560 | 11/2016 |
| WO | 2017004443 | 1/2017 |
| WO | 2017095819 | 6/2017 |
| WO | 2018022803 | 2/2018 |
| WO | 2018022811 | 2/2018 |
| WO | 2018022877 | 2/2018 |
| WO | 2018022892 | 2/2018 |

OTHER PUBLICATIONS

Alshehri et al., "Two-degree of freedom capacitive MEMS velocity sensor with two coupled electrically isolated mass-spring-damper systems," Sensors, 2014 IEEE, Valencia, 2014, 1603-1606.

Kuijpers, "Micromachined Capacitive Long-Range Displacement Sensor for Nano-Positioning of Microactuator Systems", ISBN 90-365-2119-X, Dec. 8, 2004, 208 pages.

"Ex Parte Quayle Action", U.S. Appl. No. 14/751,465, filed Sep. 15, 2017, 5 pages.

"Final Office Action", U.S. Appl. No. 14/751,536, dated May 18, 2017, 14 pages.

"International Search Report and Written Opinion", PCT Application No. PCT/US2017/044164, dated Nov. 6, 2017, 12 pages.

"Non-Final Office Action", U.S. Appl. No. 14/954,749, dated Jul. 3, 2017, 9 pages.

"Non-Final Office Action", U.S. Appl. No. 14/751,536, dated Sep. 13, 2017, 8 pages.

"Non-Final Office Action", U.S. Appl. No. 14/751,536, dated Dec. 28, 2016, 20 pages.

"PCT International Search Report and Written Opinion", PCT Application No. PCT/US2017/044188, dated Oct. 30, 2017, 14 pages.

"Signal Averaging", retrieved from http://en.wikipedia.org/w/index.php?title=Signal_averaging&oldid=382909172 on Oct. 13, 2017; As cited on EP Supplemental Search from EP Application 12825824.1 on Jun. 16, 2015, 3 pages.

"Written Opinion", PCT Application No. PCT/US2016/040538, dated Jan. 11, 2017, 11 pages.

"Written Opinion", PCT Application No. PCT/US2016/064023, dated Jun. 8, 2017, 7 pages.

"Written Opinion", PCT Application No. PCT/US2016/033566, dated Nov. 24, 2016, 6 pages.

"Final Office Action", U.S. Appl. No. 15/221,563, dated Jul. 27, 2018, 11 pages.

"Foreign Office Action", European Application No. 16816074.5, dated Jul. 6, 2018, 3 pages.

"Non-Final Office Action", U.S. Appl. No. 15/267,024, dated Sep. 7, 2018, 10 pages.

"Non-Final Office Action", U.S. Appl. No. 14/954,749, dated Jul. 17, 2018, 6 pages.

"Non-Final Office Action", U.S. Appl. No. 15/227,773, dated Jul. 25, 2018, 25 pages.

"Non-Final Office Action", U.S. Appl. No. 15/198,924, dated Sep. 11, 2018, 9 pages.

"Non-Final Office Action", U.S. Appl. No. 15/221,566, dated Sep. 14, 2018, 30 pages.

U.S. Appl. No. 13/847,521, filed Mar. 20, 2013, Swanson et al.
U.S. Appl. No. 14/954,749, filed Nov. 30, 2015, Ricardo Emilio Dao.
U.S. Appl. No. 15/160,091, filed May 20, 2016, Waters et al.
U.S. Appl. No. 15/060,098, filed May 20, 2016, Waters et al.
U.S. Appl. No. 15/198,924, filed Jun. 30, 2016, Waters et al.
U.S. Appl. No. 15/221,563, filed Jul. 27, 2016, Ozan et al.
U.S. Appl. No. 15/221,566, filed Jul. 27, 2016, Huang et al.
U.S. Appl. No. 15/267,024, filed Sep. 15, 2016, Huang et al.

"First Action Interview Office Action", U.S. Appl. No. 15/221,563, dated May 11, 2018, 5 pages.

"Foreign Office Action", Taiwanese Application No. 105120796, dated Jun. 1, 2018, 6 pages.

"Foreign Office Action", Taiwanese Application No. 106125144, dated Apr. 10, 2018, 5 pages.

"Foreign Office Action", Taiwanese Application No. 106125142, dated Apr. 10, 2018, 7 pages.

(56) References Cited

OTHER PUBLICATIONS

"Foreign Office Action", Taiwanese Application No. 106125143, dated Apr. 25, 2018, 5 pages.
"Foreign Office Action", Taiwanese Application No. 106125146, dated Jun. 21, 2018, 7 pages.
"Foreign Office Action", Taiwanese Application No. 105115787, dated Jun. 5, 2018, 4 pages.
"International Preliminary Report on Patentability", PCT Application No. PCT/US2016/064023, dated Jun. 5, 2018, 8 pages.
"Restriction Requirement", U.S. Appl. No. 15/221,566, dated May 18, 2018, 8 pages.
"Restriction Requirement", U.S. Appl. No. 15/267,024, dated May 29, 2018, 6 pages.
"Written Opinion", PCT Application No. PCT/US2017/044188, dated Jun. 11, 2018, 8 pages.
"Written Opinion", PCT Application No. PCT/US2017/044164, dated Jun. 5, 2018, 7 pages.
"International Search Report and Written Opinion", PCT Application No. PCT/US2017/044028, dated Jan. 9, 2018, 15 pages.
"International Search Report and Written Opinion", PCT Application No. PCT/US2017/044043, dated Nov. 6, 2017, 15 pages.
"Invitation to Pay Additional Fees and Partial Search Report", PCT Application No. PCT/US2017/044028, dated Nov. 17, 2017, 13 pages.
"Non-Final Office Action", U.S. Appl. No. 15/160,098, dated Jan. 2, 2018, 16 pages.
"Notice of Allowance", U.S. Appl. No. 14/751,465, dated Nov. 28, 2017, 5 pages.
"Notice of Allowance", U.S. Appl. No. 14/751,536, dated Nov. 28, 2017, 7 pages.
"Preliminary Report on Patentability", PCT Application No. PCT/US2016/033566, dated Nov. 30, 2017, 8 pages.
"Final Office Action", U.S. Appl. No. 14/954,749, dated Feb. 12, 2018, 12 pages.
"Non-Final Office Action", U.S. Appl. No. 15/160,091, dated Apr. 19, 2018, 9 pages.
"Notice of Allowance", U.S. Appl. No. 15/160,098, dated Mar. 28, 2018, 7 pages.
"Pre-Interview Communication", U.S. Appl. No. 15/221,563, dated Apr. 9, 2018, 4 pages.
"Restriction Requirement", U.S. Appl. No. 15/227,773, dated Apr. 23, 2018, 9 pages.
"Restriction Requirement", U.S. Appl. No. 15/198,924, dated Apr. 4, 2018, 5 pages.
"Foreign Office Action", Taiwanese Application No. 105120796, dated Oct. 16, 2018, 6 pages.
"Foreign Office Action", Taiwanese Application No. 106125143, dated Nov. 8, 2018, 5 pages.
"International Preliminary Report on Patentability", PCT Application No. PCT/US2017/044164, dated Oct. 18, 2018, 20 pages.
"International Preliminary Report on Patentability", PCT Application No. PCT/US2017/044188, dated Nov. 21, 2018, 19 pages.
"Notice of Allowance", U.S. Appl. No. 15/160,091, dated Oct. 31, 2018, 8 pages.
"Foreign Office Action", Chinese Application No. 201610629158.4, dated Jan. 16, 2019, 6 pages.

* cited by examiner

COMPOSITE VIBRATORY IN-PLANE ACCELEROMETER

CROSS REFERENCE TO RELATED APPLICATION

This application claims the benefit of commonly-assigned U.S. Provisional Patent Application No. 62/367,624 filed Jul. 27, 2016, which is hereby incorporated by reference herein in its entirety.

FIELD OF THE INVENTION

This invention generally relates to systems and methods for detecting and measuring inertial parameters, such as acceleration. In particular, the systems and methods relate to vibratory inertial sensors implementing time-domain sensing techniques.

BACKGROUND

Vibratory inertial sensors typically oscillate a sense mass at a known drive frequency and measure perturbations of the sense mass to detect inertial forces and parameters. However, there is sometimes a need, especially when using systems with a single drive mechanism for multiple sensors, to drive the sense mass at a frequency that may not be its optimal sensing frequency. Allowing the sense mass to respond to accelerations at a frequency other than its drive frequency may be important to maintain the sensor's sensitivity to inertial forces.

SUMMARY

Accordingly, systems and methods are described herein for measuring inertial parameters with a sense mass at a frequency other than its drive frequency. A system comprising a sense mass can be mechanically coupled to a drive mass. The sense mass can respond to an inertial force in a first direction at a first frequency, while the drive mass is driven in the first direction at a second frequency. A first time-domain switch can be configured to generate an output voltage based on a first current generated in part by the sense mass. The system can include logic in signal communication with the first time-domain switch and configured to determine a time interval based on the output voltage.

In some examples, a resonant frequency of the sense mass is different from a resonant frequency of the drive mass. In some examples, the first frequency is the resonant frequency of the sense mass, and the second frequency is the resonant frequency of the drive mass. In some examples, the second frequency may be higher than the first frequency. In some examples, the drive mass can be mechanically coupled to the sense mass with coupling springs compliant in the first direction.

In some examples, the system may further comprise an anchor structure rigidly coupled to the support structure, and the drive mass can be mechanically coupled to the anchor structure with drive springs. In some examples, the spring constant of the coupling springs can be higher than the spring constant of the drive springs.

In some examples, the system may further comprise an arm having a major axis that passes radially from the anchor structure to the drive mass. In some examples, the drive springs can be coupled to the arm and configured to cause the drive mass to move substantially in the first direction as the arm is rotated about an axis perpendicular to the plane defined by the first direction and the major axis. In some examples, the first direction is substantially tangential to the rotation of the arm. In some examples, the coupling springs can have a high spring constant at high frequencies of oscillation, and a low spring constant at low frequencies of oscillation. In some examples, the drive mass can be driven with a comb drive.

In some examples, the time-domain switch comprises a first half coupled to the sense mass and a second half coupled to the support structure, and the current is generated between the first half and the second half. In some examples, the time-domain switch comprises a plurality of time-domain switches. In some examples, a second time-domain switch can be configured to generate a second voltage based on a second current generated in part by the sense mass. In some examples the first current is out of phase with the second current. The logic can be further configured to linearly combine a signal generated from the first time-domain switch with a signal generated from the second time-domain switch. In an example, the logic can be further configured to determine an inertial parameter based at least in part on the time interval.

Another example described herein is a method for determining an inertial parameter by responding to an inertial force with a sense mass in a first direction at a first frequency, driving, in the first direction at a second frequency, a drive mass mechanically coupled to the sense mass, generating, from a first time-domain switch, an output voltage based on a first current generated in part by the sense mass, and determining a time interval based on the output voltage.

In some examples, the method can include responding to an inertial force with the sense mass at a resonant frequency of the sense mass, and driving the drive mass at a resonant frequency of the drive mass, and the resonant frequency of the sense mass can be different from the resonant frequency of the drive mass. In some examples, oscillating the sense mass can further comprise mechanically coupling the drive mass to the sense mass with coupling springs compliant in the first direction. In some examples, driving the drive mass can further comprise mechanically coupling the drive mass to an anchor structure with drive springs, and wherein the anchor structure is rigidly coupled to the support structure. In some examples, mechanically coupling the sense mass to the drive mass and mechanically coupling the drive mass to the support structure further comprise setting the spring constant of the coupling springs to be lower than the spring constant of the drive springs.

In some examples, the drive mass is driven with a comb drive. In some examples, generating an output voltage can further comprise wherein the time-domain switch comprises a first half coupled to the sense mass and a second half coupled to the support structure, and generating a current between the first half and the second half. In some examples, the method can further comprise generating, from a second time-domain switch, a second voltage based on a second current generated in part by the sense mass, and wherein the first current is out of phase with the second current. In some examples, the method further comprises linearly combining a signal generated from the first time-domain switch with a signal generated from the second time-domain switch.

In some examples, the method can comprise determining an inertial parameter based at least in part on the time interval. In some examples, the method can further comprise determining acceleration based at least in part on the time interval.

BRIEF DESCRIPTION OF THE DRAWINGS

Further features of the subject matter of this disclosure, its nature and various advantages, will be apparent upon consideration of the following detailed description, taken in conjunction with the accompanying drawings, in which like reference characters refer to like parts throughout, and in which.

DETAILED DESCRIPTION

Figure 1:
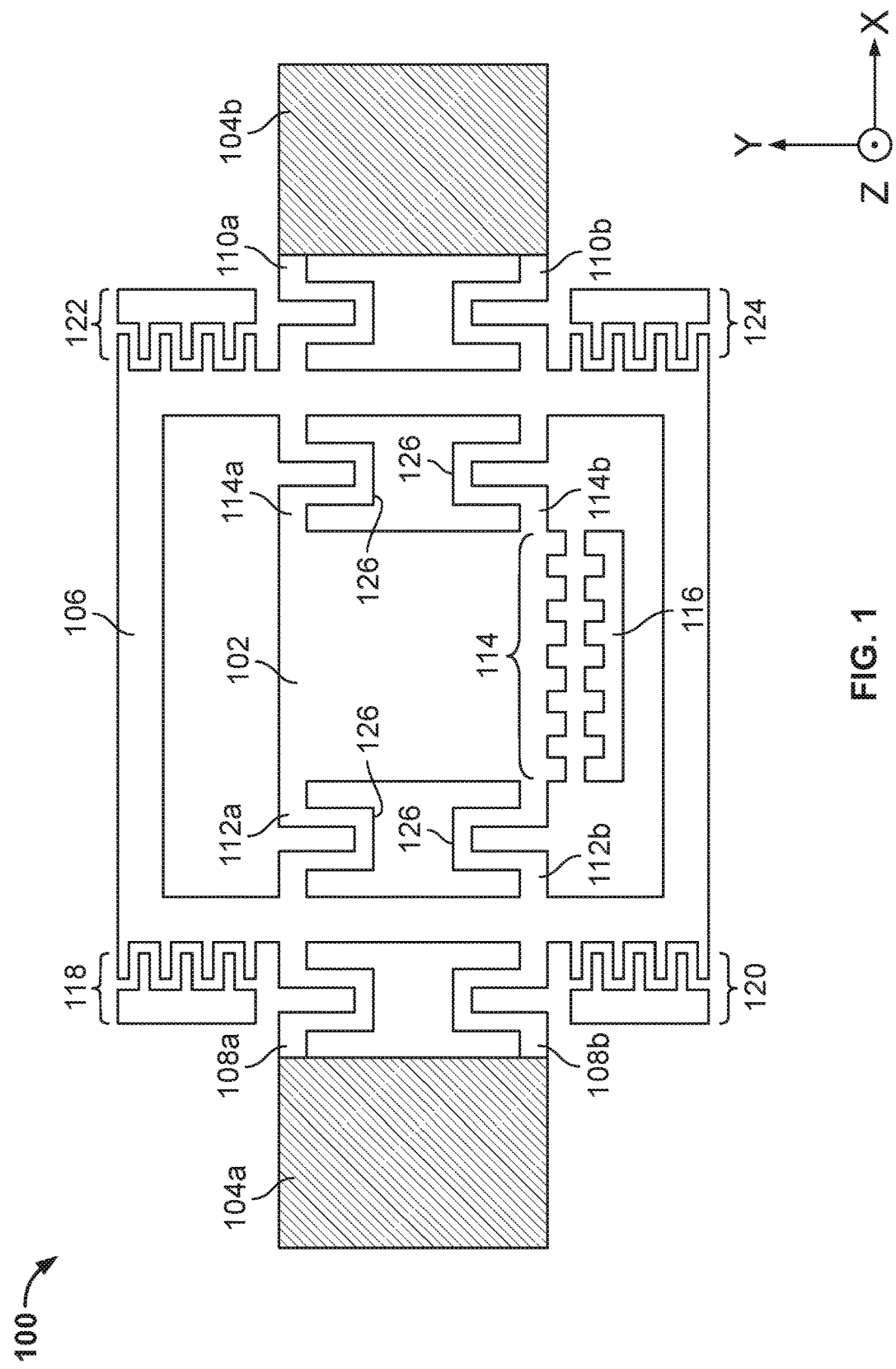
FIG. 1 depicts an overhead view of a composite mass accelerometer according to an illustrative implementation of the present invention.

To provide an overall understanding of the disclosure, certain illustrative implementations will now be described, including systems and methods for measuring inertial parameters with a sense mass responding to accelerations at a frequency other than its drive frequency.

Vibratory sensors use the measured perturbations of an oscillating sense mass to determine inertial parameters and forces acting on the sensor. These measured perturbations may be physical perturbations of the sense mass from a neutral equilibrium. These perturbations are converted to analog electrical signals as a result of the electro-mechanical nature of a sensing system. Because the physical movement of the sense mass translates to its output analog signal, the physical oscillation frequency of the sense mass has a direct relation to the sensitivity of the inertial sensor.

One type of vibratory inertial sensor is an accelerometer, in which the oscillating sense mass may be restricted to movement in a single axis. As a result of input acceleration or inertial forces, the sense mass may be perturbed in this single axis of oscillation, and the difference between its resting oscillation and perturbed oscillation used to determine inertial parameters. Thus in a vibratory accelerometer, the single axis of oscillation may also be its single axis of detection of inertial forces.

The architecture and system of vibratory accelerometers may also be used as a reference clock by producing an electrical signal at constant time intervals, which may in turn be used to calibrate other measurements. The architecture and systems of vibratory accelerometers may also be used as filters such as a bandpass filter by oscillating at a fixed or tunable resonant frequency in response to an input drive frequency. In this way the vibratory accelerometer filters out all other frequencies in the input signal, producing an output analog electrical signal corresponding to its resonant frequency. Multiple vibratory accelerometers tuned to different resonant frequencies and responsive to the same input signal may be used in parallel to increase the bandwidth of the filtering.

In the particular case of time-domain methods of sensing, the frequency of oscillation of the sense mass, and thus the rate of change of its displacement, affects the resolution of measured time intervals used to calculate inertial parameters or any other time dependent variable of interest. In accelerometers, having a relatively low oscillation frequency, as opposed to the higher oscillation frequencies used, for example, in vibratory gyroscopes, allows the detected time values to better reflect sense mass movement. Increasing the resolution of the measured time intervals also increases the accuracy of a measurement of the inertial parameters perturbing the sense mass oscillation.

However, it may sometimes be necessary to drive the sense mass at a frequency that is not its optimal frequency for achieving a high signal to noise measurement of accelerations, which tend to be at low frequencies. This may occur, for example, when a vibratory accelerometer is integrated into a larger drive system that may include sensors or other devices for which a much higher or much lower drive frequency is optimal. Allowing the vibratory accelerometer to respond to accelerations at a frequency that is different from its drive frequency may therefore be desirable.

To allow the sense mass to respond to perturbations at frequencies other than its drive frequency, the resonant frequency of the sense mass may be set to a frequency within a range of the perturbations one wishes to detect. To fix the resonant frequency, and allow it to respond independently of the drive mass, the sense mass may be mechanically coupled to the drive mass using springs, which have an inherent value called a spring constant. A spring constant is an intrinsic property of a spring, which describes its relative compliance to outside forces. Thus springs with low spring constants expand or comply more to outside forces than springs with high spring constants. In the composite mass accelerometers described herein, the spring constant may be defined purely by the geometry of the springs. Springs may comprise a uniform isotropic material, such as doped or undoped silicon. Springs may also have material properties such as varying widths, segments, segment lengths, and moments of inertia to tailor portions of the spring and achieve the desired variations in spring constants. The spring constants of the springs between the sense mass and the drive mass will partially define the resonant frequency of the sense mass, and allow the sense mass to be driven by the drive mass while also independently responding to accelerations at frequencies that would not otherwise be detectable by monitoring the motion of the drive mass. The relation between the sense mass resonant frequency and the spring constant of these springs is described in further detail with reference to FIG. 1 and FIG. 2.

FIG. 1 depicts an overhead view of a composite mass accelerometer 100 according to an illustrative implementation of the present invention. The composite mass accelerometer 100 may measure an inertial parameter that results from inertial forces acting on it or on a system to which it is coupled. This parameter may be velocity, acceleration, jerk, or any other derivative of motion. The composite mass accelerometer 100 has anchors 104a and 104b that stabilize and connect the accelerometer to a stationary layer of the composite mass accelerometer, such as a bottom layer (not shown), cap layer (not shown), or both the bottom and cap layers. The anchors 104a and 104b connect a first set of drive springs 108a and 108b and a second set of drive springs 110a and 110b, respectively, to a drive mass 106. The drive mass 106 is then connected to a sense mass 102 by a first set of coupling springs 112a and 112b and a second set of coupling springs 114a and 114b. A first half of a time-domain switch ("TDS") structure 114 is coupled to the sense mass, while a second half of the TDS structure 116 is shown as rigidly coupled to the bottom layer of the composite mass accelerometer, but may also be rigidly coupled to a cap layer, or both the bottom and cap layers. The TDS structure can have a different number of teeth than shown in FIG. 1. The drive mass 106 is driven into oscillation by drive structures 118, 120, 122 and 124. The composite mass accelerometer 100 may be monolithically integrated.

The composite mass accelerometer 100 comprises three layers: a device layer containing the features depicted in FIG. 1, a bottom layer (not shown), and a cap layer (not shown). The bottom layer and the cap layer may be made from different wafers than the device layer. One or more of the features of the device layer may be made from the wafers containing the bottom layer and/or the cap layer. The space between the bottom layer and the cap layer may be at a constant pressure below atmospheric pressure. The space between the bottom layer and the cap layer may be at partial vacuum. A getter material such as titanium or aluminum may be deposited on the interior of the space to maintain reduced pressure over time.

The drive mass 106 is shown in FIG. 1 as a frame enclosing the sense mass 102. The drive mass 106 may also be in any form capable of uniformly transferring a drive oscillation to the sense mass 102. The drive mass 106 may also drive other sensors or any device requiring actuation (not shown). The springs 108a, 108b, 110a, 110b, 112a, 112b, 114a and 114b are shown with "u" bends 126, but may also be in any topology capable of restricting motion to a single linear axis, which is shown in FIG. 1 as the x-axis. Common forms of springs 108a, 108b, 110a, 110b, 112a, 112b, 114a and 114b may also be serpentine springs, straight beam springs, crab-leg springs, etc. Springs 108a, 108b, 110a, 110b, 112a, 112b, 114a and 114b ensure that the drive mass 106 and sense mass 102 oscillate only in the x-axis as shown in FIG. 1 by being substantially compliant only in the x axis, and rigid in both the y and z axes. As can be appreciated, composite mass accelerometer 100 may be rotated in the x-y plane to oscillate along any linear direction within the x-y plane.

The drive structures 118, 120, 122, and 124 are shown in FIG. 1 as capacitive comb drives. The capacitive comb drives may have one stationary set of teeth rigidly coupled to a bottom layer, a cap layer, or both a bottom and cap layer, while a second, interdigitated set is connected to the drive mass 106. The drive structures 118, 120, 122 and 124 may also be any device capable of driving the drive mass into oscillation. The electrical signal controlling the drive structures 118, 120, 122 and 124 may be a constant electrical signal generated through feedback circuitry to maintain resonant oscillation of the drive mass 106. The feedback circuitry may also adjust a drive voltage to drive structures 118, 120, 122 and 124 until the amplitude reaches a desired setpoint, such as an amplitude associated with the resonant frequency of the sense mass. Another example of a control signal may be a periodic "pinged" signal that is turned on and off, creating a stepped electrostatic force to initiate harmonic oscillation. The "pinged" signal may be coordinated between drive structures on opposite sides of the drive mass 106, such as drive structures 118 and 122 as shown in FIG. 1, to create a "push/pull" electrostatic force on the drive mass 106. The drive structures may be powered on or off in response to a user initiating or closing an application on a mobile device. Start up times of oscillating inertial devices can range from 10 milliseconds to multiple seconds, depending on the quality factor of the resonators and other design factors.

Drive springs 108a, 108b, 110a and 110b may have the same spring constant, denoted $k_D$. Coupling springs 112a, 112b, 114a and 114b may have the same spring constant, denoted $k_C$, where $k_D$ may be greater than $k_C$. The resonant frequency of the drive mass 106, denoted $f_D$, may be different from the resonant frequency of the sense mass 102, denoted $f_S$. The resonant frequencies $f_D$ and $f_S$ may be partially dependent on the spring constant values of $k_D$ and $k_C$, as well as the masses of both the drive mass and the sense mass, denoted $M_D$ and $M_S$ respectively. The relation between these variables is as follows:

$$f_D = \frac{1}{2\pi}\sqrt{\frac{2k_D}{M_D + M_S}} \qquad (1)$$

$$f_S = \frac{1}{2\pi}\sqrt{\frac{2k_C}{M_s}} \qquad (2)$$

Thus as shown in equations (1) and (2), the values of spring constants $k_C$ and $k_D$ as well as the mass of the drive mass $M_D$ and sense mass $M_S$ will define the resonant frequency of the two masses, shown in FIG. 1 as 106 and 102, respectively. These variables can thus be tuned to obtain the frequencies or ratio of frequencies that may be desired for a particular application. As can be appreciated, in some contexts $f_D$ may be greater than $f_S$, but it is also possible for $f_D$ to be less than or equal to $f_S$. Typical values for $k_C$ may range from 10 to 1000 N/m. Typical values for $k_D$ may range from 10 to 1000 N/m. Typical values for $M_D$ may range from 10 μg to 1 mg. Typical values for $M_S$ may range from 10 μg to 1 mg. Drive frequency $f_D$ may be in a range from 10 to 30 kHz, with an optimum value of 25 kHz. Sense frequency $f_S$ may be in a range from 1to 10 kHz, with an optimum value of 4 kHz.

The choice of values for $k_D$, $M_D$, $k_C$, and $M_S$, as well as the drive frequency may also affect whether or not there is relative motion between the sense mass 102 and the drive mass 106. Given low values of $k_C$, or large differences between $M_S$ and $M_D$, it may be possible for the sense mass 102 to oscillate relative to the drive mass 106. In this case, stationary TDS teeth 116 may instead be incorporated into the drive mass 106, such that the output signal produce by TDS structures 114 and 116 records relative motion between sense mass 102 and drive mass 106. This TDS signal would then be used like any other TDS signal described herein to determine inertial parameters from time intervals.

The ratio of the linear displacement of the sense mass to the input acceleration, which describes the ability of a signal (denoted $S_{accel}$) produced by the sense mass 102 to detect acceleration, has the relation:

$$S_{accel} \propto \frac{1}{f_S^2} \qquad (3)$$

Thus, as can be appreciated, in order to increase the sensitivity of the composite mass sensor to acceleration, one would ideally minimize the value of $f_S$. The Q factor, parasitic capacitance, package deformations and other factors unrelated to the frequency of oscillation will also affect the output signal, however the dependence on $f_S$ is a primary factor for the sensitivity of an accelerometer.

While equations (1) and (2) show the drive and coupling spring stiffness as constants, it is also possible to design springs with non-linear stiffness across a range of frequencies. This non-linearity may be achieved through the topological or material design of the spring. Thus a coupling spring may have a higher effective value of $k_C$ at higher frequencies and a lower effective value of $k_C$ at lower frequencies. This might mean that driving the drive mass at a high frequency, for example, during a start up time of the sensor, would cause the sense mass to oscillate approximately at the same frequency as the drive mass (since the spring coupling the two would be very stiff and the two masses would behave approximately as a single mass). Then reducing the drive frequency of the drive mass would decrease the coupling (value of $k_C$) between the two masses, allowing the sense mass to respond to accelerations at a different frequency from the drive mass, and lowering its resonant frequency. This design might decrease the start up time of the composite mass accelerometer by quickly bringing the sense mass to its operating frequency, rather than gradually building up momentum in the sense mass from the drive mass via weaker coupling springs between the two. The drive springs may also have non-linear values of $k_D$.

Figure 2:
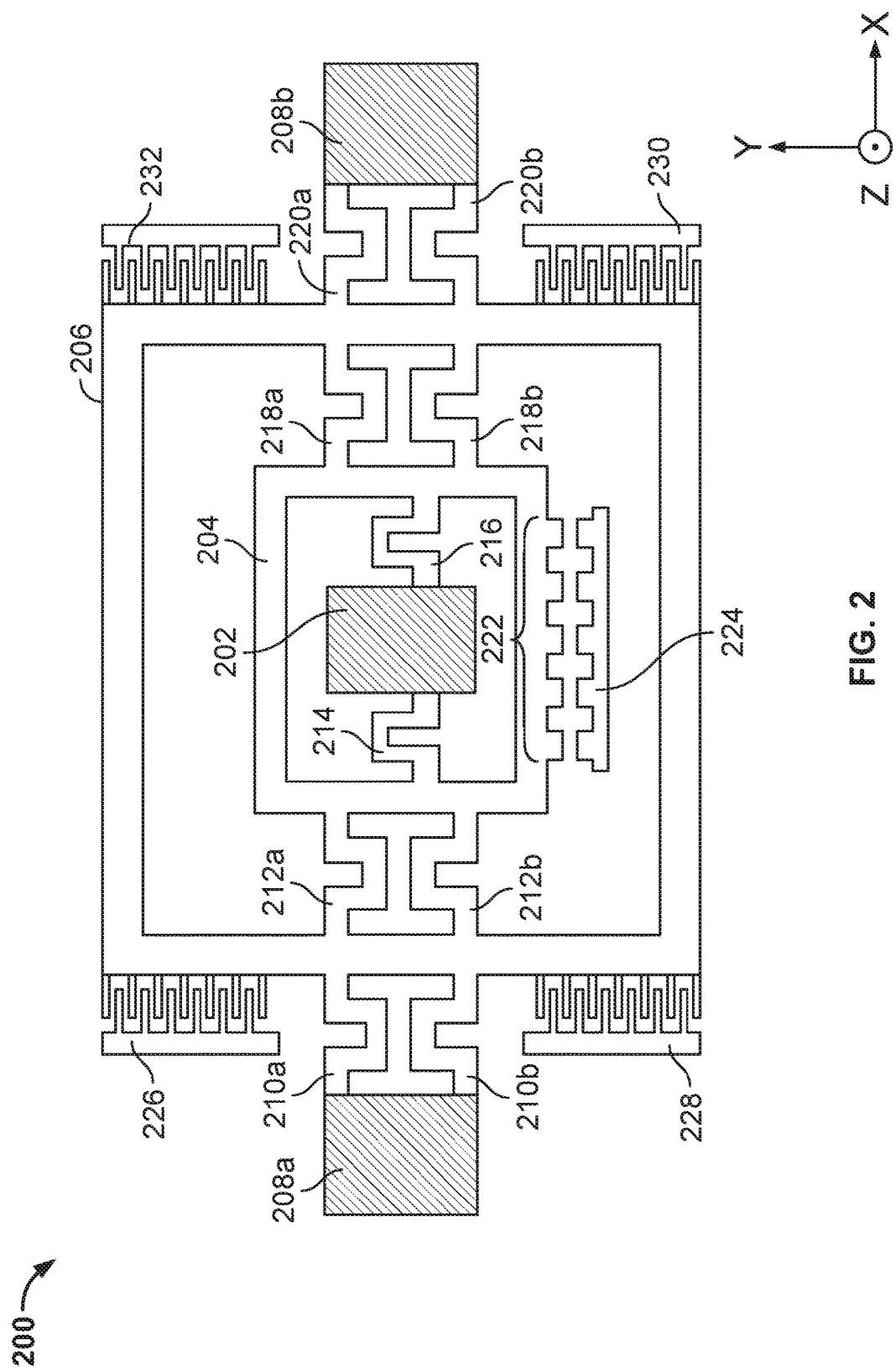
FIG. 2 depicts an overhead view of a composite mass accelerometer according to another illustrative implementation.

FIG. 2 depicts an overhead view of a composite mass accelerometer 200 according to an illustrative implementation. Anchor structures 208a, 208b and 202 are rigidly secured to a bottom layer (not shown), cap layer (not shown), or both the bottom and cap layers of the composite mass accelerometer 200 which stabilizes the accelerometer's oscillation. Drive springs 210a, 210b, 220a and 220b connect the drive mass 206 to the anchors 208a and 208b. The drive mass is then connected to a sense mass 204 via coupling springs 212a, 212b, 218a and 218b. The sense mass is in turn connected to a central anchor 202 via anchoring springs 214 and 216. The first half of a TDS structure 222 is coupled to the sense mass 204, while the second half of the TDS structure 224 is rigidly anchored to the bottom layer of the composite mass accelerometer. Drive structures 226, 228, 232, and 230 drive the drive mass 206 into oscillation. This oscillation in turn causes the sense mass 204 to oscillate. Both masses are shown as frame structures, but may be in any geometric form capable of regular harmonic oscillation.

The drive structures 226, 228, 232 and 230 are shown in FIG. 2 as capacitive comb drives with one set of interdigitated fingers rigidly coupled to the bottom layer of the composite mass structure, and the second set of interdigitated fingers coupled to the drive mass 206. Other drive structures and drive signals are discussed in further detail with reference to FIG. 1.

The TDS structure comprising moveable and fixed elements 222 and 224 are shown with a set of aligned teeth. There may be more than one TDS structure coupled between the sense mass 204 and the bottom layer of the composite mass accelerometer 200. The TDS structure may have different alignments of teeth as those shown by 222 and 224. The TDS structure may have a different number of teeth than shown in FIG. 2. The TDS structure may be in any orientation capable of sensing movement of the sense mass with respect to the bottom layer of the composite mass accelerometer 200 or any other anchoring reference structure. The TDS structure is described in further detail with reference to FIG. 6 and FIG. 9.

The anchoring springs 214 and 216 may have the same spring constant, denoted $k_A$, and provide an additional tuning option for setting the resonant frequencies of the drive mass 206 and sense mass 204, denoted $f_D$ and $f_S$ respectively. The coupling springs 212a, 212b, 218a, and 218b may have the same spring constant, denoted $k_C$. The drive springs 210a, 210b, 220a and 220b may have the same spring constant, denoted $k_D$. The resonant frequencies $f_D$ and $f_S$ will be functions of the the mass of the drive mass, denoted $M_D$, the mass of the sense mass $M_S$, and the spring constants $k_A$, $k_C$, and $k_D$.

Typical values for $k_C$ may range from 10 to 1000 N/m. Typical values for $k_D$ may range from 10 to 1000 N/m. Typical values for $M_D$ may range from 10 μg to 1 mg.

Typical values for $M_S$ may range from 10 μg to 1 mg. Drive frequency $f_D$ may be in a range from 10 to 30 kHz, with an optimum value of 25 kHz. Sense frequency $f_S$ may be in a range from 1 to 10 kHz, with an optimum value of 4 kHz.

The anchoring structure 202 anchors the oscillation of the sense mass 204 to a bottom layer, a cap layer, or both the bottom and cap layers of the composite mass accelerometer 200. This anchor may therefore help stabilize the oscillation frequency of the sense mass to a single frequency. This anchor may also help ensure that the sense mass oscillates in a single axis, which is shown at FIG. 2 as the x-axis.

Figure 3:
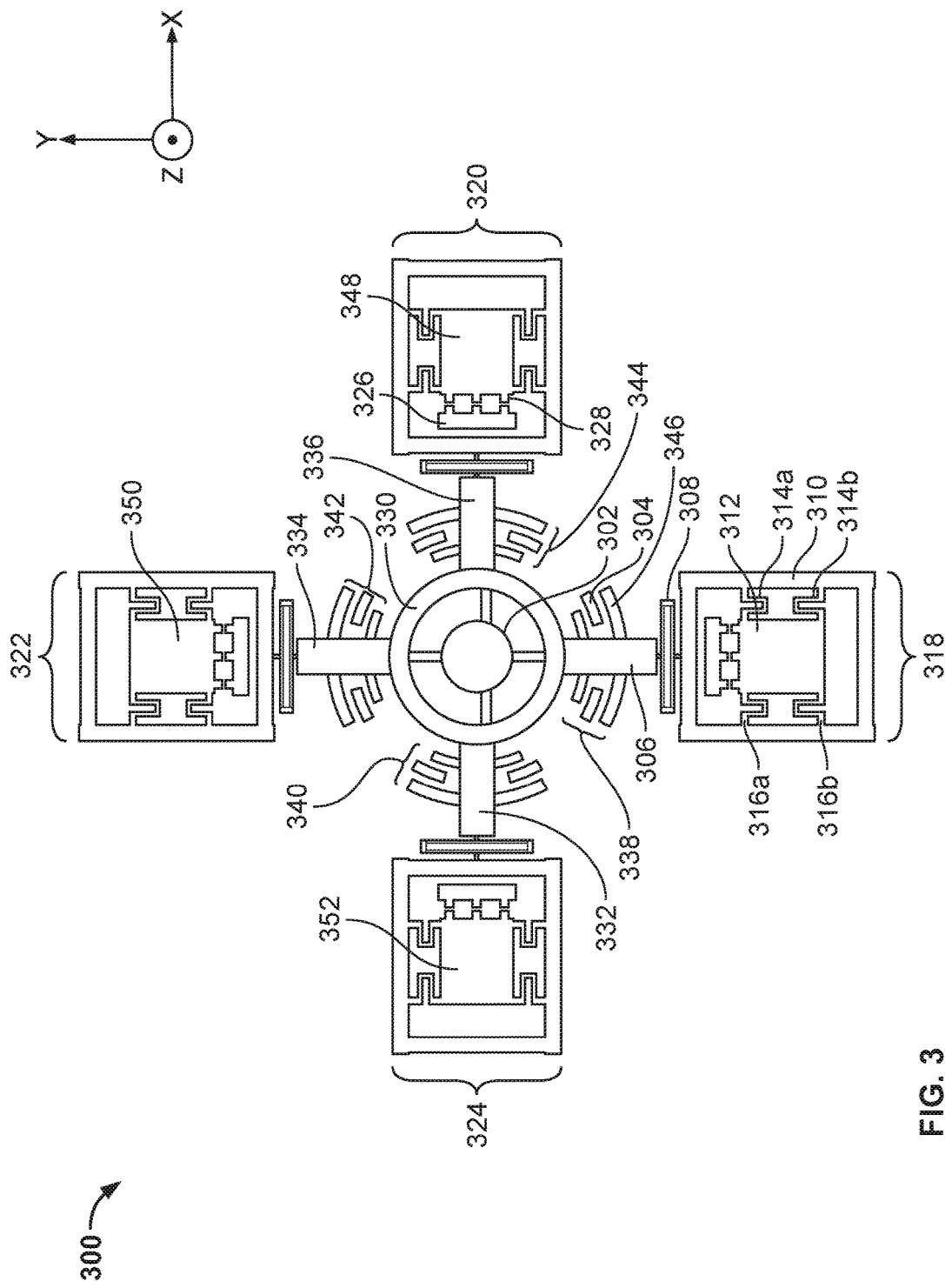
FIG. 3 depicts the integration of four composite mass accelerometers into a single drive system, according to an illustrative implementation.

FIG. 3 depicts the integration of four composite mass accelerometers into a single drive system 300, according to an illustrative implementation. A central anchor 302 stabilizes the system 300 and rigidly couples it to a bottom layer (not shown), a cap layer (not shown), or both a bottom and cap layer of the single drive system. The central anchor 302 is then connected to a central drive frame 330, from which radial arms 306, 332, 334 and 336 extend. These radial arms 306, 332, 334 and 336 are coupled to drive structures 338, 340, 342 and 344 respectively, however fixed components such as 304 may also be rigidly coupled to a cap layer, or both a bottom and a cap layer. Drive structures 338, 340, 342 and 344 are shown in FIG. 3 to each have fixed components such as 304 rigidly anchored to the bottom layer of a drive system, and movable components such as 346 coupled to the radial arms. Drive structures 338, 340, 342 and 344 rotationally oscillate the central drive frame 330 about the central anchor 302 in the x-y plane, as shown in FIG. 3, when a voltage is applied between the fixed and movable components of the drive structures 338, 340, 342 and 344. This voltage may be a constant electrical signal generated through feedback circuitry to maintain resonant oscillation of the drive masses of composite mass accelerometers 318, 320, 322 and 324, as well as the central drive frame 330, radial arms 306, 332, 334 and 336, and any other structures associated with these drive structures. The feedback circuitry may adjust the drive voltage until the amplitude of oscillation reaches a desired setpoint. The control signal may also be a "pinged" signal or a "push/pull" signal.

The radial arms 306, 332, 334 and 336, as well as the central drive frame 330 are rigid, and convey their rotational motion to the composite mass structures 318, 320, 322 and 324. The radial arms 306, 332, 334 and 336 are then each coupled to a rotational to linear motion spring such as 308.

Rotational to linear motion springs substantially convey the rotational oscillation of the central drive frame 330 and radial arms 306, 332, 334 and 336 into linear oscillation of a proof mass in the x or y directions, as shown in FIG. 3. In some examples, the remaining rotational component of motion of the proof mass is 100 ppm of the linear component. In some examples, the rotational component may be as low as 10 ppm of the linear component. Thus, for a proof mass on a vertically-oriented arm and rotating about the origin and having an oscillation in the x direction of 1 micron, the proof mass only moves in the y direction by 0.1 nanometers (corresponding to 100 ppm) or as little as 0.01 nanometers (corresponding to 10 ppm).

Thus the rotational to linear motion springs shown in FIG. 3 ensure that the composite mass accelerometers 320 and 324 oscillate substantially only in the y direction, whereas composite mass accelerometers 322 and 318 oscillate substantially only in the x direction. As can be appreciated, the single drive system may be rotated in any direction in the x-y plane as shown, and composite mass accelerometers 320 and 324 will oscillate in a direction perpendicular to the composite mass accelerometers 322 and 318. The oscillations of the drive frame such as 310, conveys the oscillation from the rotational to linear motion spring to a sense mass such as 312 shown in FIG. 3 via coupling springs such as 316a, 316b, 314a and 314b. The coupling springs allow the sense masses 312, 348, 350 and 352 to respond to accelerations at a frequency other than the frequency of either their associated drive frames, such as 310, or the central drive frame 330. The factors contributing to this frequency difference are described in more detail with reference to FIG. 1 and FIG. 2.

The length of the radial arms 306, 332, 334 and 336 will affect the oscillation amplitude and displacement of the sense masses, 312, 348, 350 and 352, of composite mass accelerometers 318, 320, 322 and 324 respectively. Increasing the length of the radial arms 306, 332, 334 and 336 will result in higher amplitudes and more displacement of the sense mass, which in turn increases the signal-to-noise ratio of the accelerometer by increasing the signal strength. This relation can be appreciated from the general equation (4) relating the tangential velocity v of an object rotating about an axis at angular velocity ω to its radial distance r from the axis of rotation:

$$v = r\omega \qquad (4)$$

Thus as the length of the radial arm r increases, the tangential velocity v (which is partially converted to a single axis oscillation and displacement of the sense mass) will also increase without needing to increase the drive velocity ω of the drive system. A small drive velocity ω can therefore be "amplified" to larger displacements through the use of the radial arms 306, 332, 334 and 336, reducing the power consumption of the drive systems. This also means that the length of the lever arm can be used to tune the desired displacement, signal output, and oscillation of the composite sense masses 318, 320, 322 and 324. This can allow for precise and stable tuning of the oscillation amplitudes of the accelerometers, since they will be dictated in part by the fabrication geometry of the accelerometer.

A TDS structure has a first half 328 coupled to the oscillating sense mass, and a second half 326 rigidly coupled to the bottom layer, cap layer, or both bottom and cap layers of the single drive system 300. The TDS structure may detect and measure the acceleration of the single drive system. As shown in FIG. 3, composite mass accelerometers 322 and 318 may measure acceleration in the x direction, whereas composite mass accelerometers 320 and 324 may measure acceleration in the y direction.

Additional sensors, including gyroscopes, resonators, or any other sensor requiring an actuating oscillation may be added to the central drive frame 330 with additional radial arms. These additional sensors may have lever arms of different lengths than the accelerometers or than each other. This may establish different amplitude ratios of oscillations between sensors.

Figure 4:
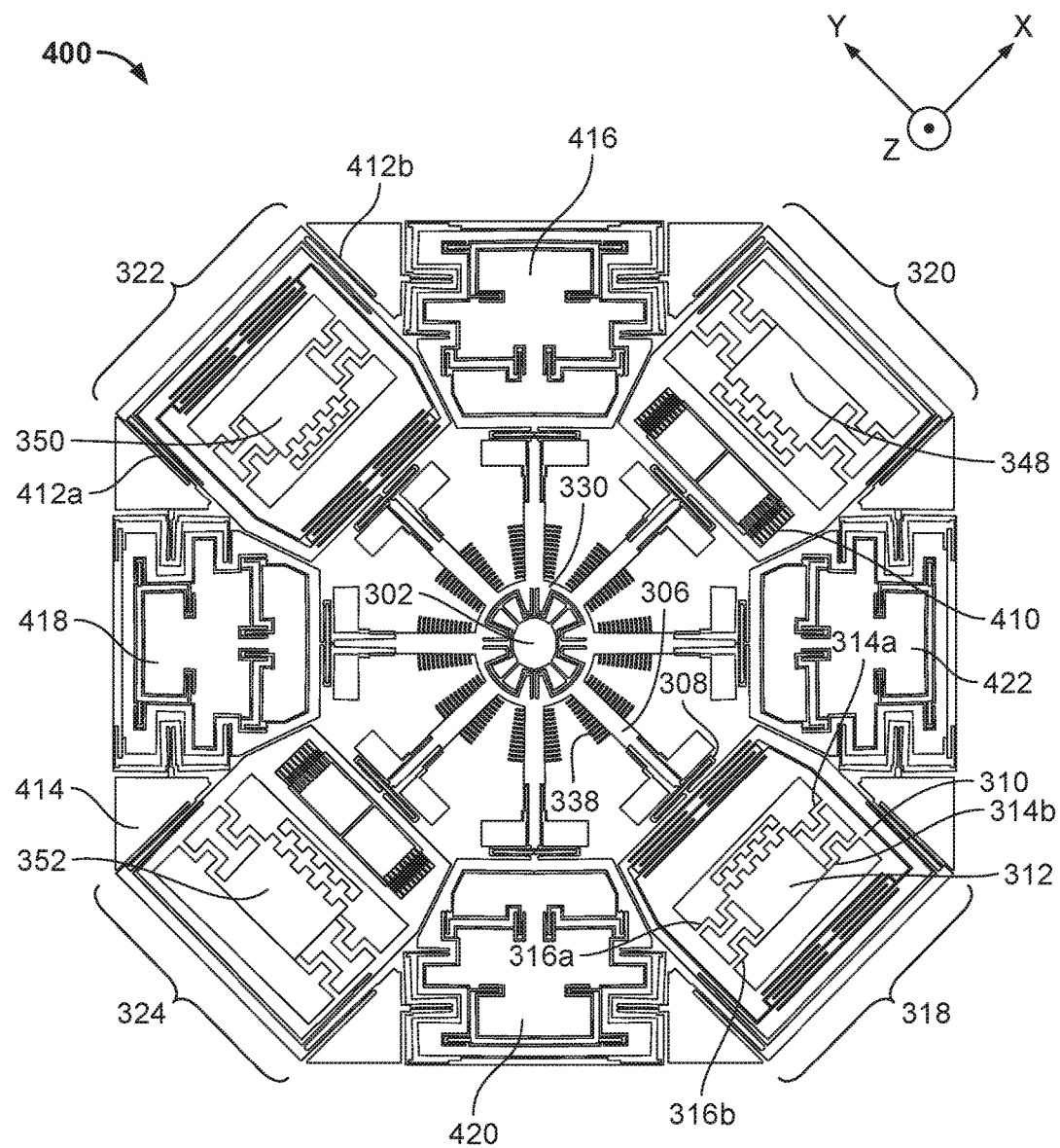
FIG. 4 depicts the integration of four composite mass accelerometers with four gyroscopes into a single drive system, according to an illustrative implementation.

FIG. 4 shows an example of such a system. FIG. 4 depicts the integration of four composite mass accelerometers with four gyroscopes into a single drive system 400, according to an illustrative implementation. A central anchor 302 anchors the system 400 and is rigidly coupled to a bottom layer (not shown). Radial arms such as 306 extend from a central drive frame 330 to each of the eight sensors 318, 320, 322, 324, 416, 418, 420 and 422. These radial arms are driven with drive structures such as 338, which are shown in FIG. 4 as comb drives. A drive structure such as 338 oscillates the single drive system in the x-y plane about the central anchor 302. A rotational to linear motion spring such as 308 will convert this central rotational oscillation to linear oscillations of each of the sensors 318, 320, 322, 324, 416, 418, 420 and 422 depicted in FIG. 4. The gyroscope sensors 416, 418, 420 and 422 will each oscillate at a frequency substantially at the drive frequency of the central drive frame 330 and the radial arms that extend to each of them. The composite mass accelerometers 318, 320, 322, 332, 324, which may act in this system as accelerometers, will each have drive masses such as 310 and drive springs such as 316a, 316b, 314a and 314b which convey the oscillation of the drive frame 330 to sense masses such as 312. The sense masses such as 312 may respond to accelerations at a frequency different from the drive frequency of the gyroscope sense masses or the central drive frame 330 and radial arms such as 306.

The composite mass accelerometers 324 and 320 will substantially oscillate in the y-axis, whereas composite mass accelerometers 318 and 322 will substantially oscillate in the x-axis. Thus 320 and 324 may be implemented as y-axis accelerometers capable of sensing acceleration or any y-axis component of an inertial parameter, and 318 and 322 may be implemented as x-axis accelerometers capable of sensing acceleration or any x-axis component of an inertial parameter.

The gyroscopes 416, 418, 420 and 422 are attached to a base structure 414 that stabilizes the single drive system 400. The gyroscopes 416, 418, 420 and 422 are connected to this base structure with suspension springs on either side of the gyroscope, as shown at 412a and 412b. These suspension springs allow the gyroscopes 416, 418, 420 and 422 to both vibrate in response to the drive frequency and oscillate in response to Coriolis forces. The gyroscopes in FIG. 4 are shown with lever arms of the same length as those of the accelerometers, however they may be different lengths to establish different amplitude ratios of oscillation between sensors.

As shown in equation (3), the sensitivity of the composite mass accelerometers shown in FIG. 4 as 318, 320, 322, 332, 324 will increase as the frequency of their sense masses 312, 348, 350 and 352 oscillations decrease. However, for the vibratory gyroscopes 416, 418, 420 and 422, their sensitivity will increase as their frequency of oscillation increases. Thus by incorporating the composite mass accelerometers 318, 320, 322 and 324 into the single drive system of FIG. 4, the vibratory gyroscopes 416, 418, 420 and, 422, central drive frame 428 and drive structures may be driven at a high frequency without compromising the sensitivity of the system 400's ability to detect acceleration or other inertial parameters.

There are several benefits of a single drive system as shown in FIG. 4. A design consideration for sensors, such as accelerometers, is the need to reduce both the space the system occupies and its power consumption. The power consumed by drive electronics is often the largest fraction of total power consumed by an oscillating inertial device. The energy required to power the drive electronics is often significantly more than the kinetic energy that would be required to oscillate the resonators. One reason for this difference is that leakage in the drive electronics consumes significant amounts of power. Thus, driving multiple inertial sensors with a single oscillating drive reduces the overall power consumption by reducing the number of systems of drive electronics.

Furthermore, oscillating inertial sensors often do not operate continuously, but are rather turned on and off as their output is required. This may be, for example, when a user begins a navigation or virtual reality application of a mobile device on the user's mobile device that may require inertial sensing. Thus, oscillating resonators may be required to start and stop frequently. Incorporating multiple sensors into a single drive automatically coordinates their start and stop times without the need for additional synchronization control.

Synchronization across multiple sensors is also useful for reducing the effects of electronic drift or other noise sources across multiple sensors. Because all of the inertial sensors are driven by the same rotational drive structure, any drifting in the drive electronics will affect the frequency, phase and amplitudes of the inertial sensors in the same manner. Likewise, drift due to temperature, package deformations, or other forces will affect all of the inertial sensors in the same manner. Because the inertial sensors are located close to each other within the same drive frame, packaging deformations in any of the layers of the inertial sensor will tend to affect all sensors equally, reducing relative motion between sensors. The same is true for temperature and other noise sources. Thus, within a single drive system, multiple sensors may be mechanically synchronized.

Figure 5:
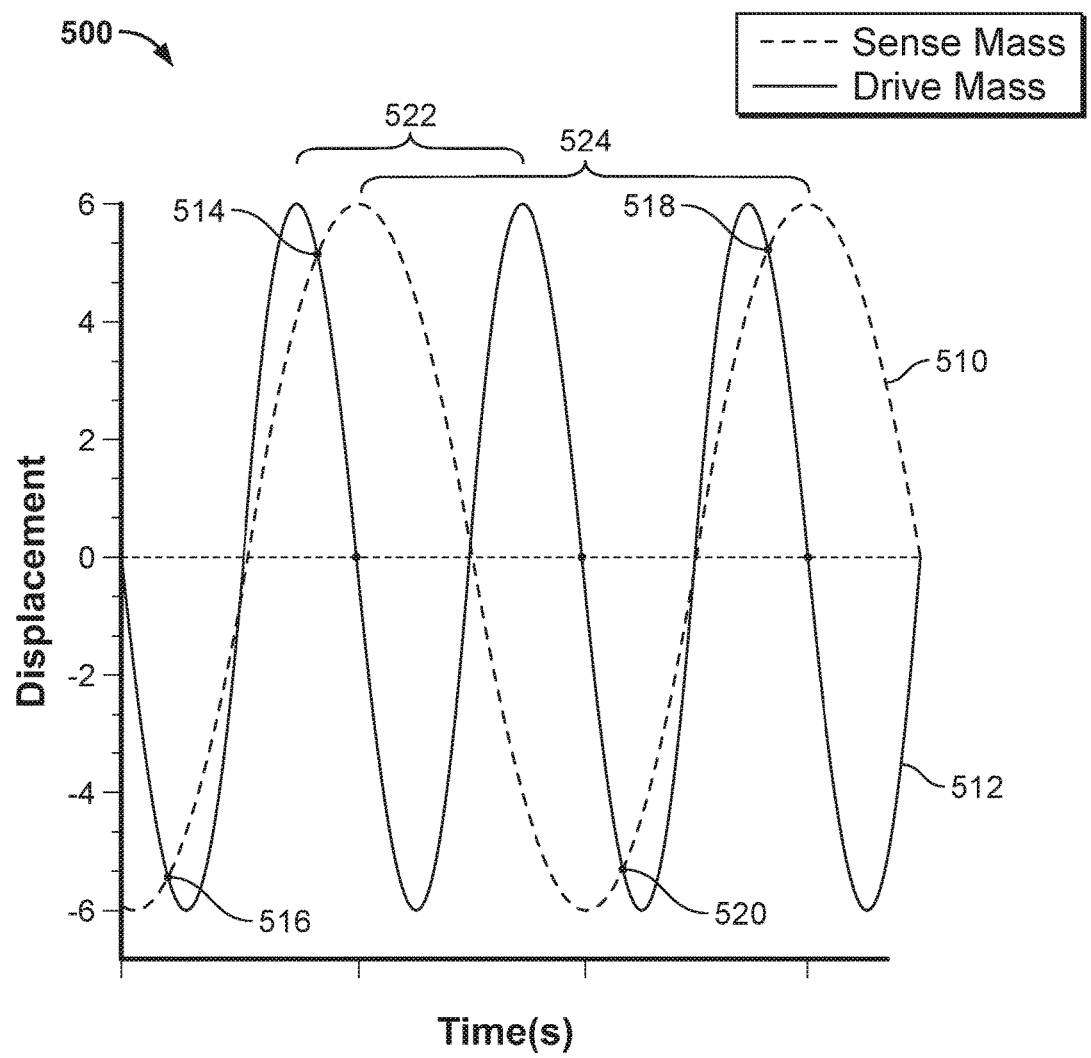
FIG. 5 depicts an example of the oscillation frequency of a drive mass and a sense mass resonant frequency for a composite mass accelerometer, according to an illustrative implementation.

FIG. 5 depicts an example of the oscillation frequency of a drive mass and a sense mass resonant frequency of a composite mass accelerometer, according to an illustrative implementation. In this example, the curve 510 may represent the displacement of a sense mass at its resonant frequency, whereas curve 512 may represent the displacement of a drive mass. The period of oscillation of the sense mass at its resonant frequency may be shown at time interval 524, while the period of oscillation of the drive mass at its drive frequency may be shown at time interval 522. The resonant frequency of the sense mass, given by 1/(time interval 524) is appreciably shown to be less than the oscillation frequency of the drive mass, given by 1/(time interval 522). At the crossing points shown at points 514, 516, 518 and 520, the two masses will have the same displacement. However, since the response to accelerations occurs at the lower frequency response of the sense mass, it is easier to isolate the portion of its frequency response that results from outside perturbations such as acceleration from its frequency response that results from the drive frequency. Furthermore, since the lower frequency shown by curve 510 is the sense mass' resonant frequency, its response to outside perturbations in that frequency range will be amplified, increasing the output signal and improving the measurement of inertial parameters.

Figure 6:
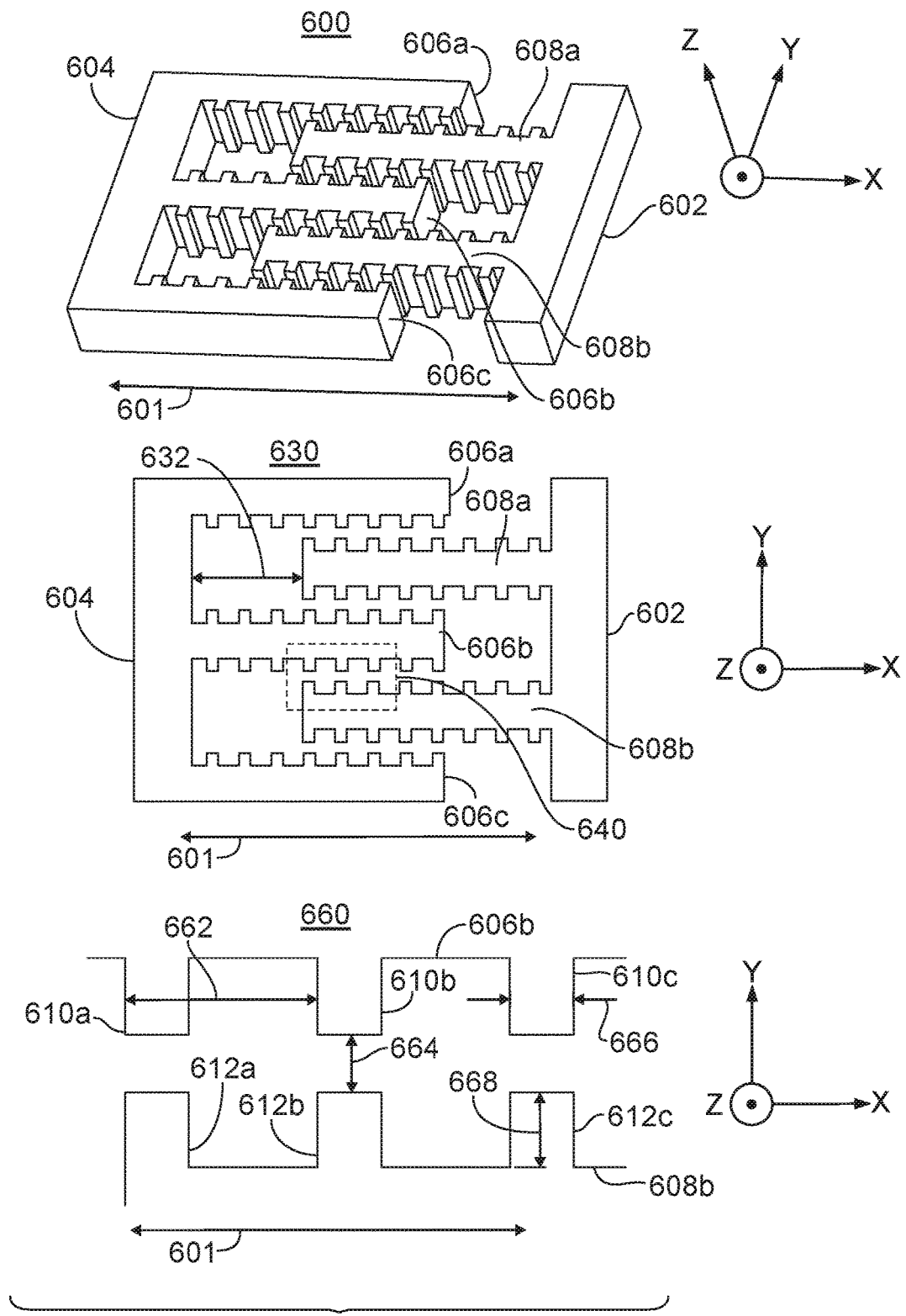
FIG. 6 depicts three views, each showing a schematic representation of the movable and fixed elements of a plurality of time-domain switch ("TDS") structures, according to an illustrative implementation.

FIG. 6 depicts three views, each showing a schematic representation of the movable and fixed elements of a plurality of TDS structures, according to an illustrative implementation. The sense mass of a composite mass accelerometer can be coupled to the movable element 602, while the fixed element 604 may be rigidly coupled to the bottom layer, a cap layer, or both the bottom and cap layers of the composite mass accelerometer. The movable element 602 and the fixed element 604 each include a plurality of interdigitated, equally spaced beams. In FIG. 6, the fixed element 604 includes beams 606a, 606b and 606c (collectively, beams 606). The movable element 602 includes beams 608a and 608b, and is separated from the fixed element 604 in the x direction by a distance 632. The distance 632 will increase and decrease as the movable element 602 oscillates with respect to the fixed element 604 in the x direction. The distance 632 is selected to minimize parasitic capacitance when the movable element 602 is in the rest position, while also taking into consideration the ease of manufacturing the structure 600. The view 660 depicts an area of interest noted by the rectangle 640 of view 630. 630 is an overhead view of the perspective view shown at 600.

Each of the beams 606 and 608 includes multiple substructures, or teeth, protruding in a perpendicular axis to the long axis of the beams (shown in FIG. 6 as the y and x axis, respectively). The beam 606b includes teeth 610a, 610b, and 610c (collectively, teeth 610). The beam 608b includes teeth 612a, 612b and 612c (collectively, teeth 612). Adjacent teeth on a beam are equally spaced according to a pitch 662. Each of the teeth 610 and 612 has a width defined by the line width 666 and a depth defined by a corrugation depth 668. Opposing teeth are separated by a tooth gap 664. As the movable beam 608b oscillates along the axis 601 with respect to the fixed beam 606b, the tooth gap 664 remains unchanged.

A capacitance may exist between the fixed beam 606b and the movable beam 608b coupled to the sensing mass. As the movable beam 608b oscillates along the axis 601 with respect to the fixed beam 606b, this capacitance will change. As the teeth 610a, 610b and 610c align with opposing teeth 612a, 612b and 612c respectively, the capacitance will increase. The capacitance will then decrease as these opposing sets of teeth become less aligned with each other as they move in either direction along the x-axis. At the position shown in view 660, the capacitance is at a maximum as the teeth 610 are aligned with teeth 612. As the moveable beam 602 moves monotonically along the axis 601, the capacitance will first gradually decrease and then gradually increase as the Nth moving tooth becomes less aligned with the Nth fixed tooth, and then aligned with the (N±i)th fixed tooth, where i=1, 2, 3, 4 . . . $i_{max}$. This process is repeated for the full range of motion for the Nth tooth, where the minimum of the oscillator's displacement occurs at the (N−$i_{max}$)th fixed tooth, and the maximum of the oscillator's displacement occurs at the (N+$i_{max}$)th fixed tooth.

The capacitance may be degenerated, meaning that the same value of capacitance occurs at multiple displacements of the moveable beam 608b. For example, the capacitance value when the Nth moving tooth is aligned with the (N+1)th fixed tooth may be the same when the Nth moving tooth is aligned with the (N+2)th fixed tooth. Thus when the moveable beam 608b has moved from its rest position by a distance equal to the pitch 662, the capacitance is the same as when the moveable beam 608b is in the rest position.

Figure 7:
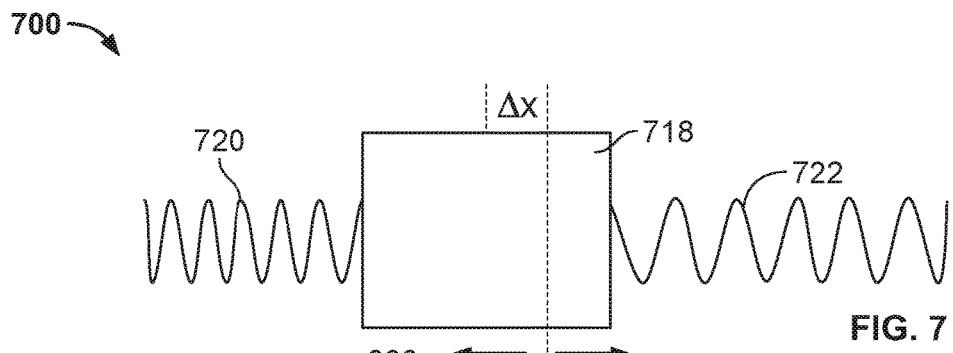
FIG. 7 depicts a conceptual schematic of a sense mass oscillation for a composite mass accelerometer, according to an illustrative implementation.

FIG. 7 depicts a conceptual schematic of a sense mass oscillation for a composite mass 700, according to an illustrative implementation. A sense mass 718 is attached to springs 720 and 722, which may be coupled to a drive mass, and which each compress or extend as the sense mass 718 oscillates in the axis of displacement 724. The spring constants of springs 720 and 722 will determine the force extension relationship of the proof mass. This can be modeled by Hooke's law, whereby the force F applied to the sense mass results in displacement Δx according to the relation:

$$F = k\Delta x \quad (5)$$

Thus as an inertial force is applied to the sense mass, it will respond with a displacement Δx that may be measured by a change in capacitance or any other electrical signal relating the physical displacement to a measurable output. The k value of an inertial accelerometer is determined by the geometry of the springs, which may be designed to be a certain value and are discussed in more detail with reference to FIGS. 1 and 2.

Figure 8:
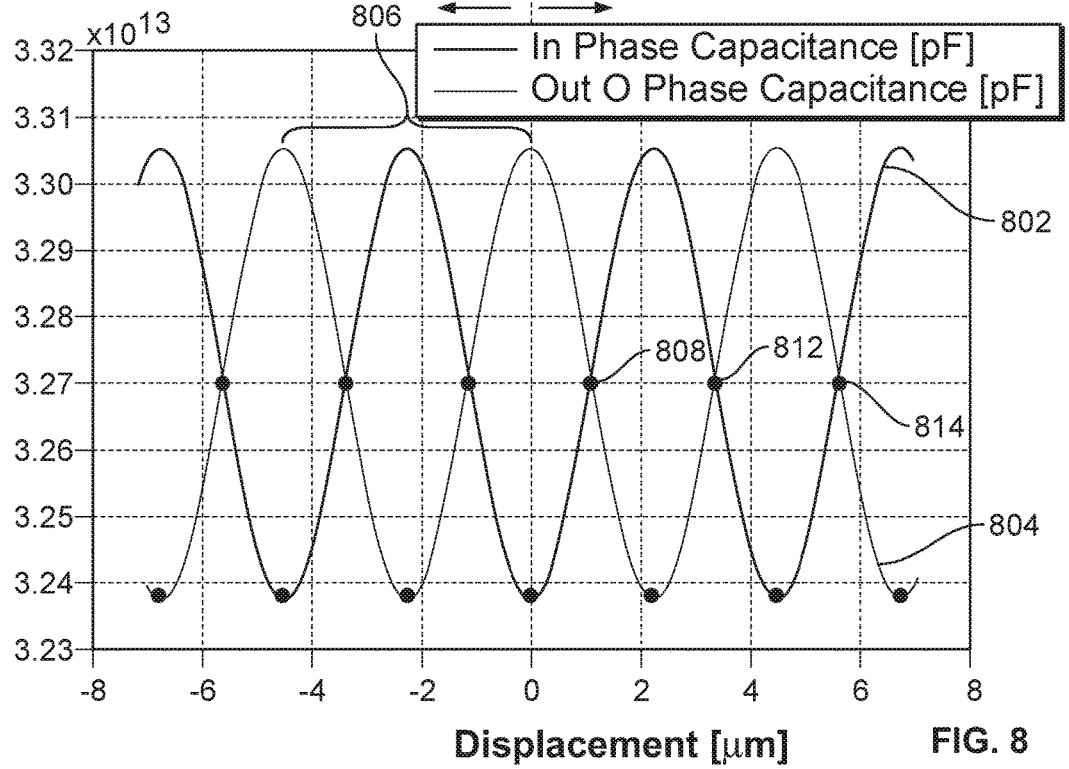
FIG. 8 is a graph showing the in phase and out of phase capacitive response to a sense mass oscillation produced by TDS structures, according to an illustrative implementation.

FIG. 8 is a graph showing the in phase and out of phase capacitive response to a sense mass oscillation produced by TDS structures, according to an illustrative implementation. FIG. 8 demonstrates the translation of the linear displacement of a sense mass into a non-linear electrical signal. An in-phase signal 804 may be generated by TDS geometry that maximizes capacitance at a sense mass' resting position. An out of phase signal 802 may be generated by TDS geometry that minimizes capacitance at a sense mass' resting position. An in-phase and an out of phase signal may be separated by a phase difference of 90° as is shown at FIG. 8, or any other phase difference desired. The in phase 804 and out of phase 802 signals may result from the displacement of the same sense mass, such that the moveable components of the TDS structures that generate signals 804 and 802 are both coupled to the same sense mass. The in phase and out of phase signals may also result from relative motion between a drive mass and a sense mass. The in phase 804 and out of phase 802 signals may be subtracted, averaged, or otherwise combined to produce a single measurement reflective of a proof mass displacement. The period 806 of an in phase signal 804 may be determined entirely by the geometry of the TDS teeth. The in phase 804 and out of phase 802 signals may have the same zero crossings as shown at 808, 812 and 814.

Figure 9:
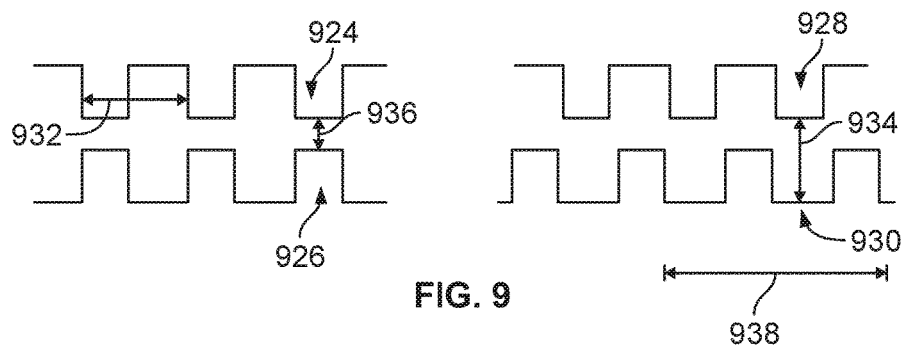
FIG. 9 depicts in and out of phase TDS structures, according to an illustrative implementation.

FIG. 9 depicts in and out of phase time-domain switches, according to an illustrative implementation. Both moveable elements 926 and 930 are shown in at their resting equilibrium without inertial forces or drive forces acting on either of them. The pitch or distance between teeth 932 defines the distance between peaks of capacitance, or the phase of the resulting nonlinear capacitive signal. A voltage may be applied between fixed element 924 and moveable element 926, as well as between fixed element 928 and moveable element 930. The distance 936 between fixed element 924 and moveable element 926 defines a minimum distance between teeth corresponding to a maximum of capacitance. The distance 934 between fixed element 928 and moveable element 930 defines a maximum distance between teeth corresponding to a minimum of capacitance. As moveable elements 926 and 930 oscillates linearly in the axis 938, the capacitance between teeth will oscillate between the minimum "aligned" state where the distance between teeth is 936, and the non aligned state where the distance between teeth is 934. This will in turn produce an electrical signal as discussed in detail with reference to FIG. 8. The moveable elements 926 and 930 may be coupled to the same sense mass, such that the electrical signal produced between elements 924 and 926, and 928 and 930 will correspond to the same physical displacement. The fixed elements 928 and 924 may be rigidly coupled to a support structure or other anchoring architecture.

Signals generated from in phase structures 924 and 926, and out of phase structures 928 and 930 may be linearly combined to produce differential signals. Differential signals may be produced by subtracting a signal produced by 924 and 926 from a signal produced by 928 and 930. This differential signal may eliminate common mode noise produced by parasitic capacitance, temperature variations, packaging deformations, ground loops, drifts in voltage bias, or any other sources of electrical noise that may affect both signals.

Figure 10:
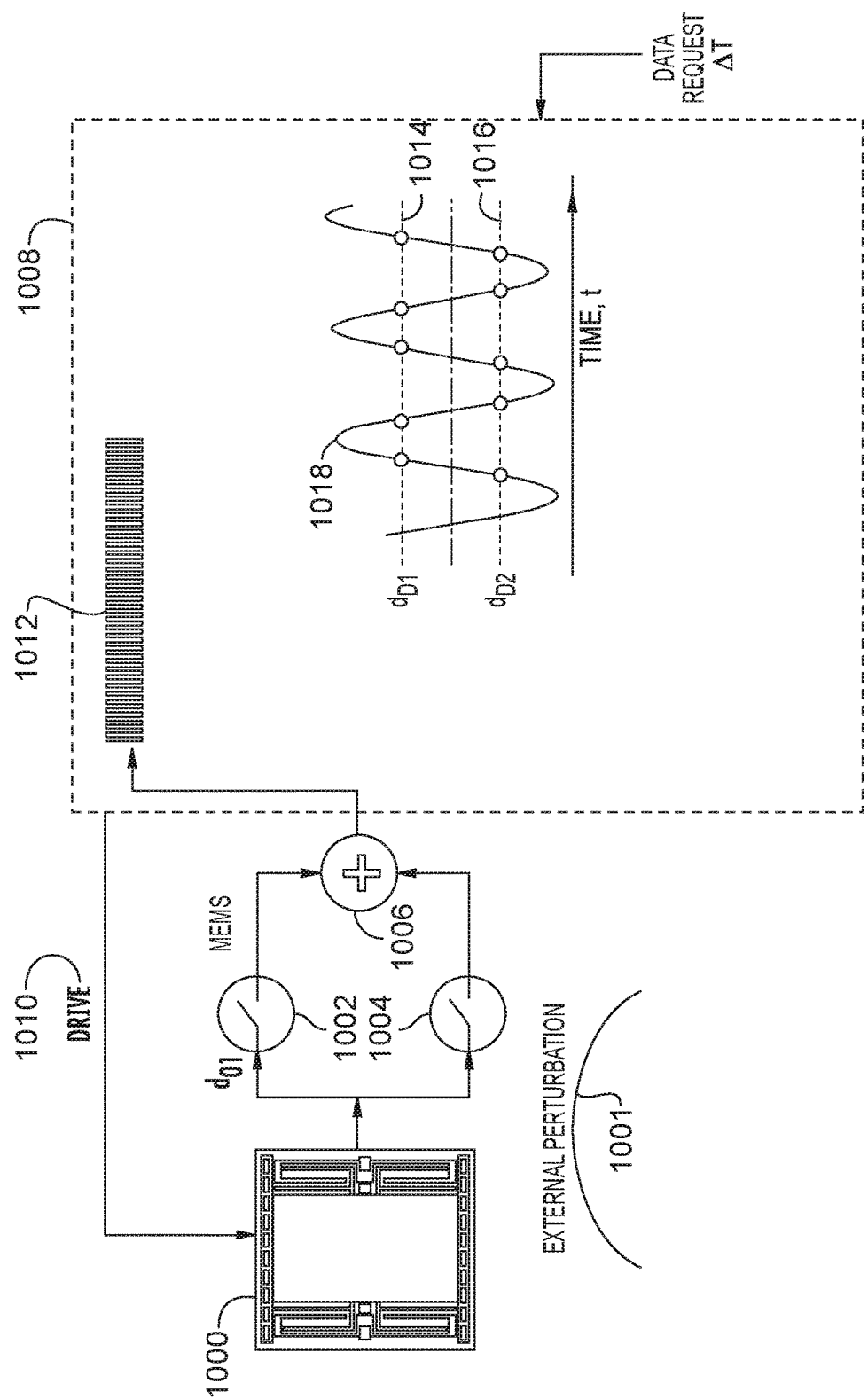
FIG. 10 depicts a process for extracting inertial information from a TDS structure, according to an illustrative implementation.

FIG. 10 depicts a process for extracting inertial information from a time-domain switch, according to an illustrative implementation. FIG. 10 includes a composite mass inertial accelerometer 1000 which experiences an external perturbation 1001. A drive signal 1010 causes a moveable portion of the accelerometer 1000 to oscillate. This moveable portion of the accelerometer 1000 may be the sense mass. An analog frontend (AFE) electrically connected to a moveable element and a fixed element of a TDS structure measures the capacitance between them and outputs a signal based on this capacitance. The AFE may measure capacitive current or a charge. Zero-crossings of the AFE output signal occur when the AFE output signal momentarily has a magnitude of zero. Zero-crossings of an output signal from the composite mass inertial accelerometer 1000 are generated at 1002 and 1004 and combined at 1006 into a combined signal. A signal processing module 1008 processes the combined analog signal to determine inertial information. One or more processes can convert the combined analog signal into a rectangular waveform 1012. This may be done using a comparator, by amplifying the analog signal to the rails, or by other methods.

The rectangular waveform 1012 has high and low values, with no substantial time spent transitioning between them. Transitions between high and low values correspond to zero-crossings of the combined analog signal. The transitions between high and low values and zero-crossings occur when a displacement 1018 of the sense mass crosses reference levels 1014 and 1016. The reference levels 1014 and 1016 correspond to physical locations along the path of motion of the sense mass. Because the zero-crossings are associated with specific physical locations, displacement information can be reliably determined independent of drift, creep and other factors which tend to degrade performance of inertial sensors.

Figure 11:
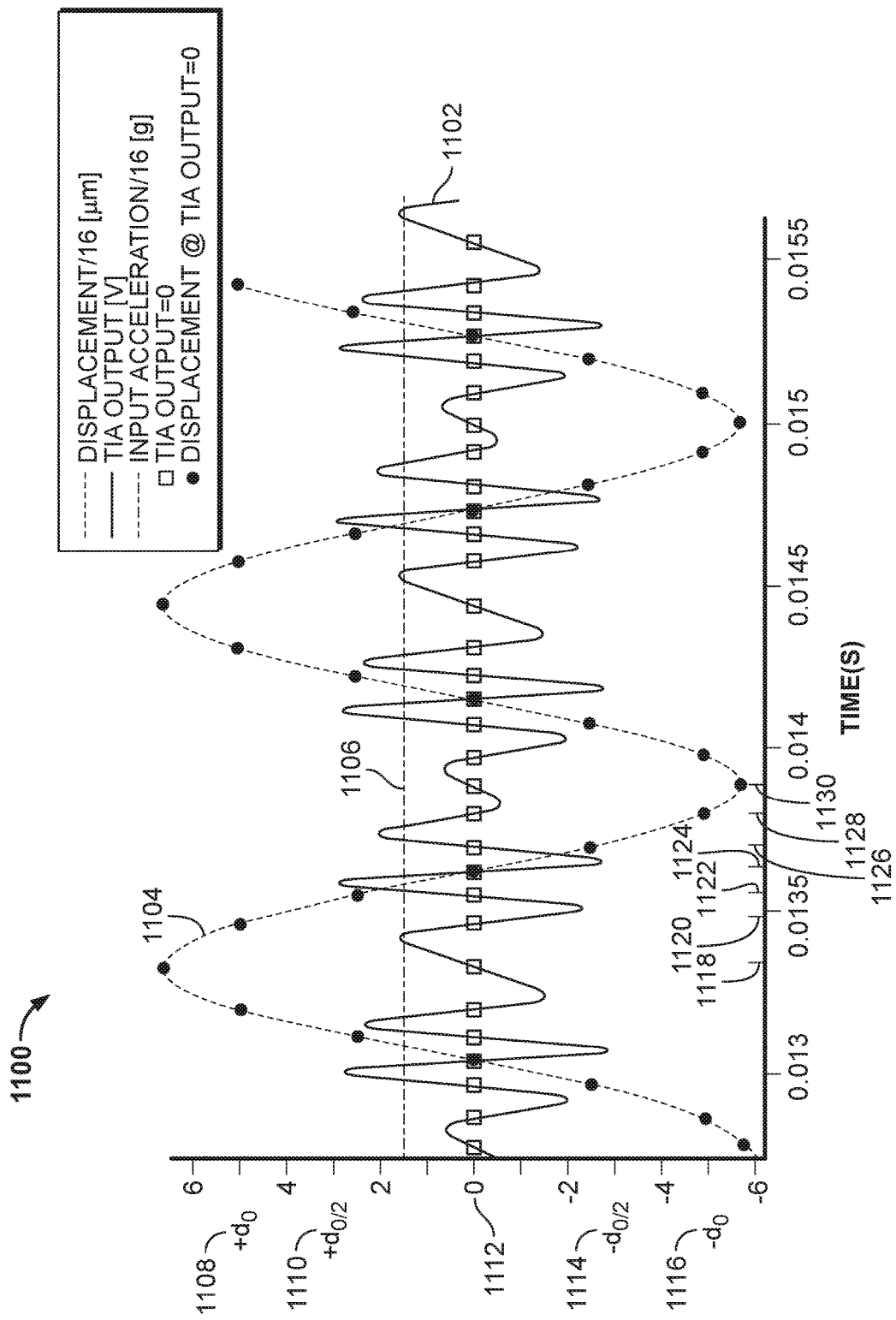
FIG. 11 is a graph representing the relationship between analog signals derived from a composite mass inertial accelerometer and the displacement of a sense mass, according to an illustrative implementation.

FIG. 11 is a graph representing the relationship between analog signals derived and the displacement of a sense mass of a composite mass sensor, according to an illustrative implementation, for example of composite mass sensors 100, 200, 318, 320, 322, 324, and 312 as shown in FIGS. 1, 2, 3 and 4, respectively. The graph 1100 represents signals derived from an oscillator in which opposing teeth are aligned at the rest position, as described in further detail with reference to FIG. 9. This oscillator may be the sense mass of a composite mass accelerometer coupled to a TDS structure. The graph 1100 includes curves 1102, 1104, and 1106. The curve 1102 represents an output of an AFE such as a transimpedence amplifier (TIA). Since a TIA outputs a signal proportional to its input current, the curve 1102 represents a capacitive current measured between moveable and fixed elements of a composite mass accelerometer. The curve 1106 represents an input acceleration applied to the accelerometer. The input acceleration represented by curve 1106 is a 15 g acceleration at 20 Hz. The curve 1104 represents displacement of the sense mass of a composite mass accelerometer.

FIG. 11 includes square symbols indicating points at which the curve 1102 crosses zero. Since capacitive current 1102 is proportional to the first derivative of capacitance, these zero-crossings in the current represent local maxima or minima (extrema) of capacitance between a moveable element and a fixed element of the composite mass accelerometer. FIG. 11 includes circular symbols indicating points on the curve 1104 corresponding to times at which curve 1102 crosses zero. The circular symbols indicate the correlation between the physical position of a moveable element of the composite mass accelerometer and zero-crossing times of the outputs of the signal 1102.

At the time 1118, the curve 1102 crosses zero because the displacement 1104 of the moveable element of the oscillator is at a maximum and the oscillator is instantaneously at rest. Here, capacitance reaches a local extremum because the moveable element has a velocity of zero, not necessarily because teeth or beams of the oscillator are aligned with opposing teeth or beams. At time 1120, the TIA output curve 1102 crosses zero because the oscillator displacement reaches the $+d_0$ location 1108. The $+d_0$ location 1108 corresponds to a displacement in a positive direction equal to the pitch distance and is a point at which opposing teeth or beams are aligned to produce maximum capacitance.

At time 1122, the TIA output curve 1102 crosses zero because the movable element of the oscillator is at a position at which the teeth are anti-aligned. This occurs when the teeth of the movable element are in an aligned position with the centers of gaps between teeth of the fixed element, resulting in a minimum in capacitance. This minimum in capacitance occurs at a location of $+d_0/2$ 1110, corresponding to a displacement of one-half the pitch distance in the positive direction.

At time 1124, the TIA output curve 1102 crosses zero because teeth of the movable element are aligned with teeth of the fixed element, producing a maximum in capacitance. The time 1124 corresponds to a time at which the movable element is at the rest position, indicated by the zero displacement 1112 on the curve 1104. At time 1126, the TIA output 1102 crosses zero because teeth of the movable element are once again anti-aligned with teeth of the fixed element, producing a local minimum in capacitance. This anti-alignment occurs at a displacement of $-d_0/2$ 1114, corresponding to a displacement of one-half the pitch distance in the negative direction.

At time 1128, the TIA output 1102 crosses zero because the teeth of the movable element are in an aligned position with respect to the teeth of the fixed element, creating a local maximum in capacitance. This local maximum in capacitance occurs at a displacement of $-d_0$ 1116, corresponding to a displacement of the pitch distance in the negative direction. At time 1130, the TIA output curve 1102 crosses zero because the movable element has an instantaneous velocity of zero as it reverses direction. This reversal of direction is illustrated by the displacement curve 1104. As at time 1118, when the movable element has a velocity of zero, capacitance does not change with time and thus the current and TIA output (which are proportional to the first derivative of capacitance) are zero.

Figure 12:
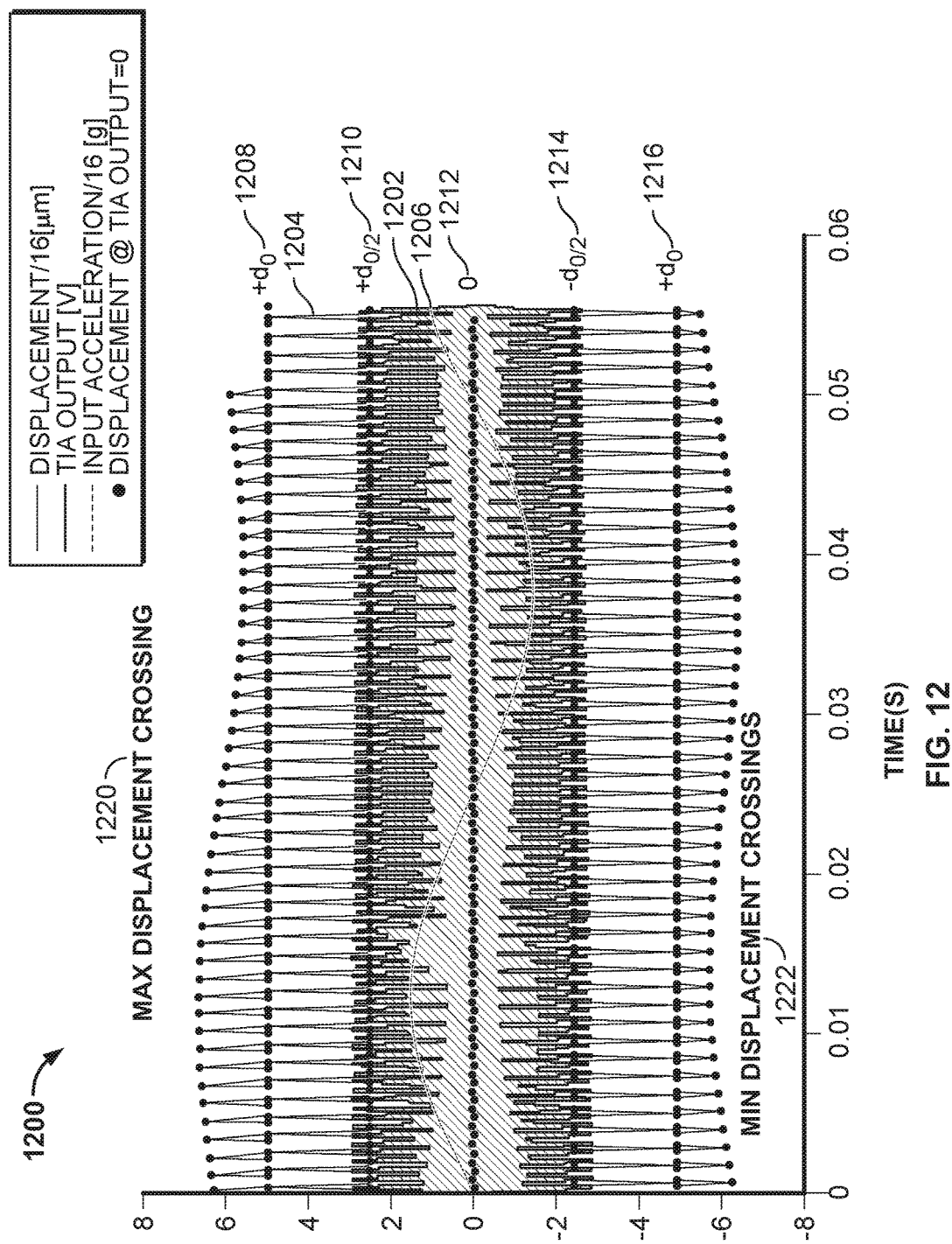
FIG. 12 is a graph showing the effects of an external perturbation on the output signal of the composite mass accelerometer, according to an illustrative implementation.

FIG. 12 is a graph showing the effects of an external perturbation on the output signal of the composite mass accelerometer, according to an illustrative implementation. The graph 1200 includes the TIA output curve 1202, a displacement curve 1204, and an input acceleration curve 1206. FIG. 12 also depicts the reference pitch locations $+d_0$ 1208, $+d_0/2$ 1210, 0 1212, $-d_0/2$ 1214, and $-d_0$ 1216, where $d_0$ is the pitch between teeth of a TDS structure, as described in further detail with reference to FIG. 6 and FIG. 9. The graph 1200 depicts the same signals depicted in the graph 1100 of FIG. 11, with the x axis of 1200 representing a longer duration of time than is shown in the graph 1100. The periodicity of the input acceleration curve 1206 is more easily discerned at this time scale. In addition, maximum displacement crossings 1220 and minimum displacement crossings 1222 can be discerned in the graph 1200 to experience a similar periodicity. In contrast to the maximum displacement crossings 1220 and the minimum displacement crossings 1222, the amplitude of which varies with time, zero-crossings of the TIA output signal 1202 triggered by alignment or anti-alignment of teeth of the fixed and movable elements at the locations $+d_0$ 1208, $+d_0/2$ 1210, 0 1212, $-d_0/2$ 1214, and $-d_0$ 1216 are time invariant. These reference crossings, the amplitude of which are stable with time, provide stable, drift-independent indications of oscillator displacement and can be used to extract inertial parameters.

Figure 13:
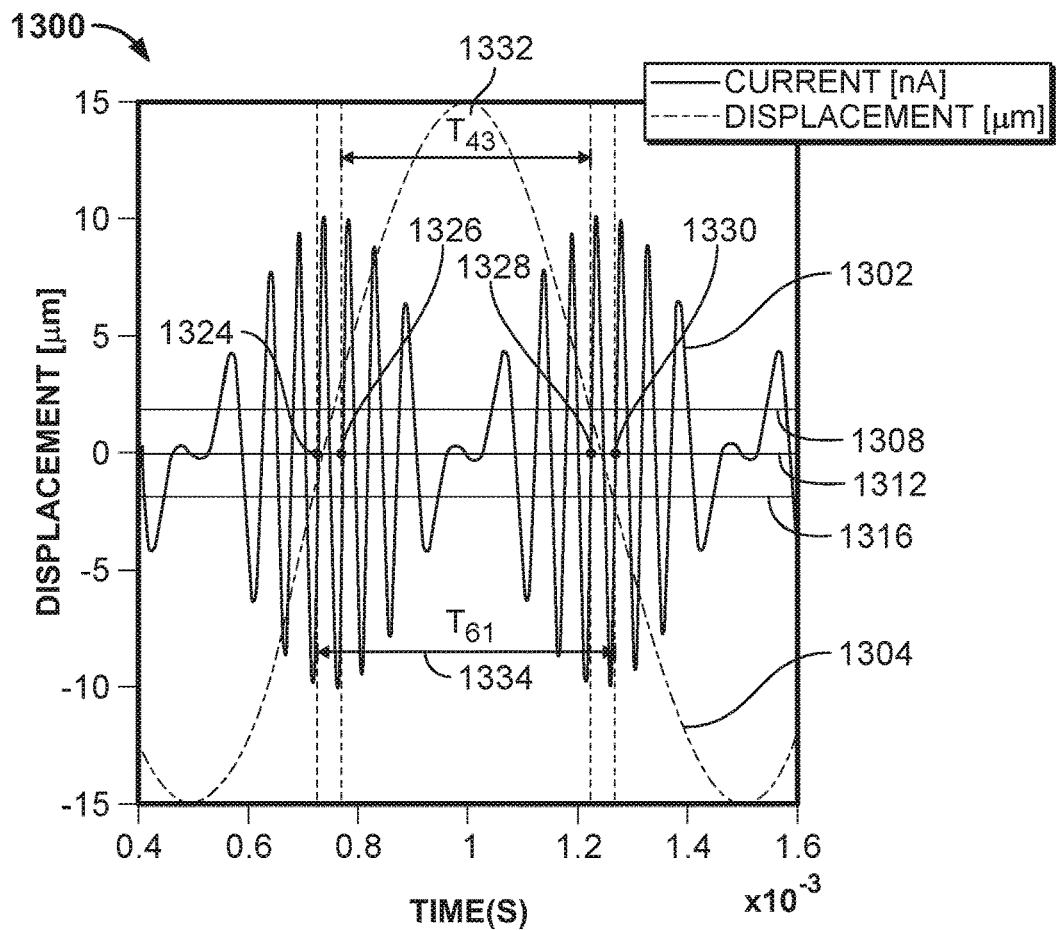
FIG. 13 is a graph illustrating a current response to the displacement of a sense mass, according to an illustrative implementation.

FIG. 13 is a graph illustrating an electrical current response to oscillations of a sense mass, according to an illustrative implementation. The graph 1300 includes a current curve 1302 and a displacement curve 1304. The current curve 1302 represents an input signal for a TIA. The TIA may produce an output signal such as the TIA output curves 1102 as shown in FIG. 11 in response to displacement of the sense mass of a composite mass accelerometer. The current curve 1302 is a capacitive current generated between fixed and movable elements of the composite mass accelerometer in response to displacement 1304. The current curve 1302 crosses zero at numerous times, including times 1324, 1326, 1328, and 1330. At the times 1324 and 1330, the movable element has a displacement of $-d_0$, where $d_0$ may correspond to the pitch distance between teeth of a TDS structure. At the times 1326 and 1328, the movable element has a displacement of $+d_0$.

The graph 1300 includes two time intervals $T_{43}$ 1332 and $T_{61}$ 1334. The time interval $T_{43}$ 1332 corresponds to the difference in time between time 1326 and time 1328. The time interval $T_{61}$ 1334 corresponds to the time difference between times 1324 and 1330. Thus, time interval $T_{61}$ 1334 corresponds to the time between subsequent crossings of the $-d_0$ 1316 location, and the time interval $T_{43}$ 1332 corresponds to the time interval between subsequent crossings of the $+d_0$ 1308 location. The methods used to determine the time intervals $T_{43}$ 1332 and $T_{61}$ 1334 can be used to determine other time intervals, such as between a crossings of the $+d_0$ 1308 and the next subsequent crossing of the $-d_0$ 1316 level, between a time interval between a crossing of the $-d_0$ 1316 level and the next crossing of the $+d_0$ 1308 level, between the time 1330 and the next crossing of the $+d_0$ 1308 level, between crossings of the zero 1312 level, between zero-crossings due to a maximum or minimum of displacement, or between any other combination of zero-crossings of the current curve 1302 or a TIA output signal corresponding to the current curve 1302.

Figure 14:
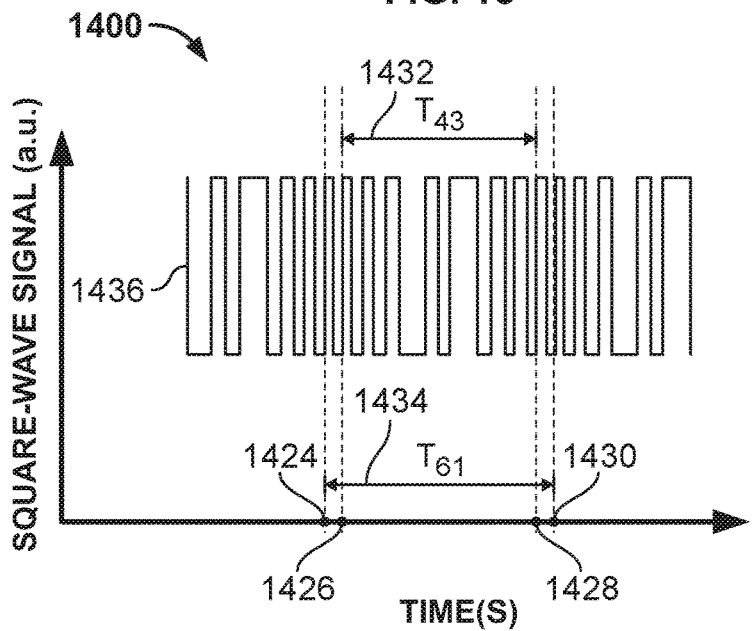
FIG. 14 is a graph showing a rectangular-wave signal produced from zero-crossing times of the current signal depicted in FIG. 13, according to an illustrative implementation.

FIG. 14 is a graph showing a rectangular-wave signal produced from zero-crossing times of the current signal depicted in FIG. 13, according to an illustrative implementation. The graph 1400 includes a rectangular waveform curve 1436. The rectangular waveform curve 1436 has substantially two values: a high value and a low value. While the rectangular waveform curve 1436 may have intermediate values as it transitions between the high and low values, the time spent at intermediate values is far less than the combined time spent at the high and low of the values.

The rectangular waveform curve 1436 can be produced by a variety of methods, including using a comparator to detect changes in an input signal, by amplifying an input signal to the limits of an amplifier so as to saturate the amplifier (amplifying to the rails), by using an analog-to-digital converter, and the like. One way to produce this rectangular waveform curve 1436 from the current curve 1302 shown in FIG. 13 is to use a comparator to detect zero-crossings of the current curve 1302. When the current curve 1302 has a value greater than a reference level (such as zero), the comparator outputs a high value, and when the current curve 1302 has a value less than the reference level (such as zero), the comparator has a low value. The comparator's output transitions from low to high when the current curve 1302 transitions from a negative value to a positive value, and the comparator's output transitions from high to low when the current curve 1302 transitions from a positive value to a negative value. Thus, times of rising edges of the rectangular waveform curve 1436 correspond to times of negative-to-positive zero-crossings of the current curve 1404, and falling edges of the rectangular waveform curve 1436 correspond to positive-to-negative zero-crossings of the current curve 1302. This can be seen at time 1424, where the rectangular waveform curve 1436 transitions from a negative to positive value, corresponding to a zero crossing at 1324 in FIG. 13. The same can be seen at time 1428 corresponding to zero crossing 1328. The rectangular waveform curve 1436 transitions from a positive value to a negative value at times 1426 and 1430, corresponding to a zero crossing at 1326 and 1330 in FIG. 13, respectively.

The rectangular waveform curve 1436 includes the same time intervals 1432 and 1434 as the current curve 1302. One benefit of converting the current curve 1302 to a rectangular waveform signal such as the rectangular waveform curve 1436 is that in a rectangular waveform signal, rising and falling edges are steeper. Steep rising and falling edges provide more accurate resolution of the timing of the edges and lower timing uncertainty. Another benefit is that rectangular waveform signals are amenable to digital processing.

Figure 15:
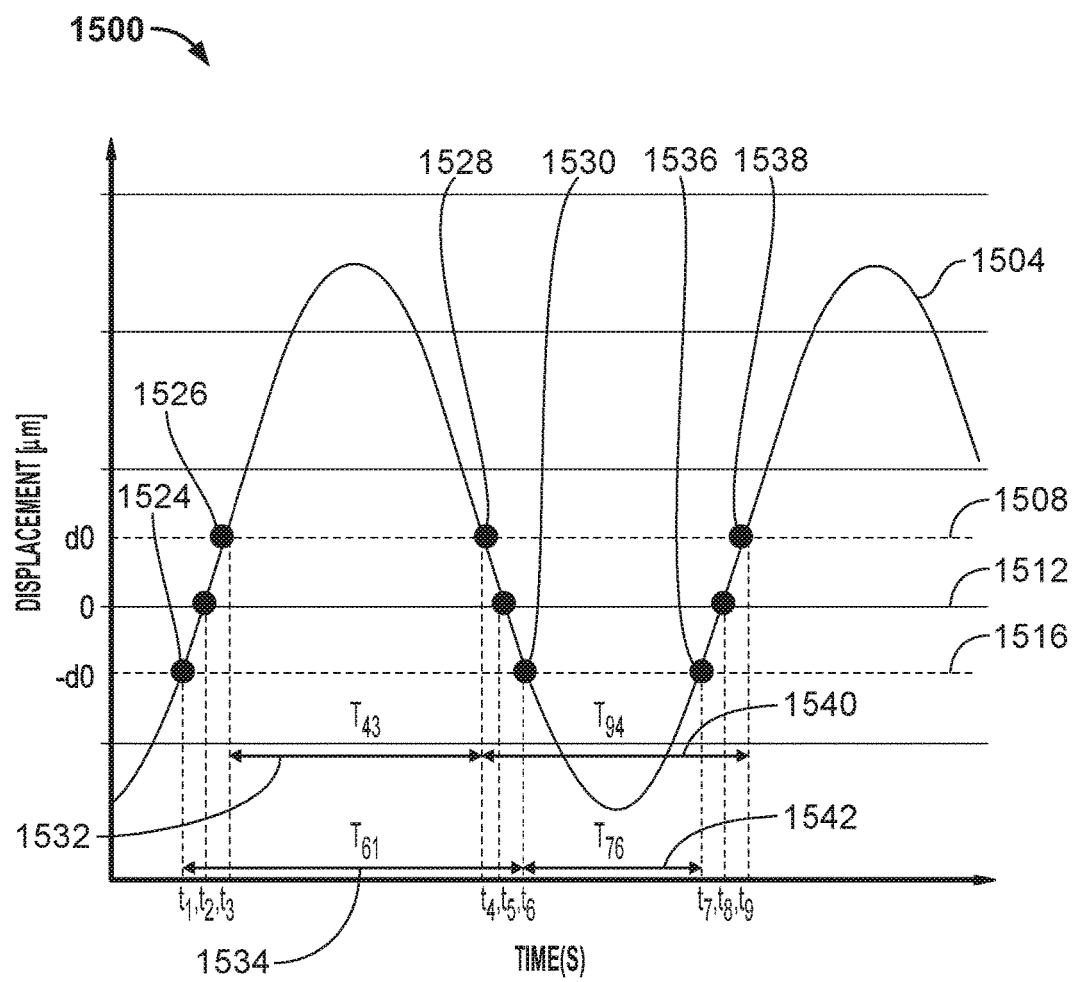
FIG. 15 is a graph showing time intervals produced from non-zero crossing reference levels, according to an illustrative implementation.

FIG. 15 is a graph showing time intervals produced from non-zero crossing reference levels, according to an illustrative implementation. The graph 1500 includes times 1536 and 1538. The graph 1500 includes the time interval $T_{94}$ 1540 and the time interval $T_{76}$ 1542, which represent crossing times of the displacement curve 1504 of reference levels 1508 and 1516 respectively. The time interval $T_{94}$ 1540 corresponds to the time interval between times 1528 and 1538. The time interval $T_{76}$ 1542 corresponds to the time interval between times 1530 and 1536. The graph 1500 also includes time interval T43 1532 and $T_{61}$ 1534, corresponding to a time interval between times 1526 and 1528, and 1524 and 1530, respectively. The reference levels, shown at 1508, 1512, and 1516 may be any value within the displacement range of the sense mass. The reference levels 1508, 1512 and 1516 may be predetermined, and may correspond to the physical geometry of a TDS structure, such as the pitch distance between teeth.

As can be seen with reference to FIG. 12, the oscillator displacement as shown by the displacement curve 1204 experiences an offset that is correlated with input acceleration as indicated by the acceleration curve 1206. Thus, one way to detect shifts of the displacement of an oscillator and thus input acceleration is to compare relative positions of zero-crossing times of a displacement curve produced by the oscillator. As shown in FIG. 15, a sum of the time intervals $T_{43}$ 1532 and $T_{94}$ 1540 represents a period of oscillation as does a sum of the periods $T_{61}$ 1534 and $T_{36}$ 1542. In comparing a subset of the period, such as comparing the time interval $T_{43}$ 1532 with the sum of $T_{43}$ 1532 and $T_{94}$ 1540 represents the proportion of time that the oscillator spends at a displacement greater than $+d_0$ 1508. An increase in this proportion from a reference proportion indicates a greater acceleration in a positive direction than the reference. Likewise, a decrease in this proportion from the reference indicates a greater acceleration in the negative direction. Other time intervals can be used to calculate other proportions and changes in acceleration.

In some examples, integrating portions of the rectangular waveform using the systems and methods described herein can be performed to determine relative positions of zero-crossing times and thus acceleration, rotation and/or velocity. In other examples, displacement of an oscillator can be determined from the time intervals depicted in FIG. 15 using equations (6), (7), and (8).

$$d = \frac{2d_0 \cos\left(\pi \frac{T_{61}}{P_{m1}}\right)}{\cos\left(\pi \frac{T_{61}}{P_{m1}}\right) - \cos\left(\pi \frac{T_{43}}{P_{m2}}\right)} - d_0 \qquad (6)$$

$$P_{m1} = T_{61} + T_{76} \qquad (7)$$

$$P_{m2} = T_{43} + T_{94} \qquad (8)$$

Displacement of the oscillator can be converted to an acceleration using Hooke's Law. Displacement of the oscillator can be calculated recursively for each half cycle of the oscillator. Using this information, the displacement of the oscillator can be recorded as a function of time. This allows the calculation of external perturbations with zero drift and lower broadband noise.

Figure 16:
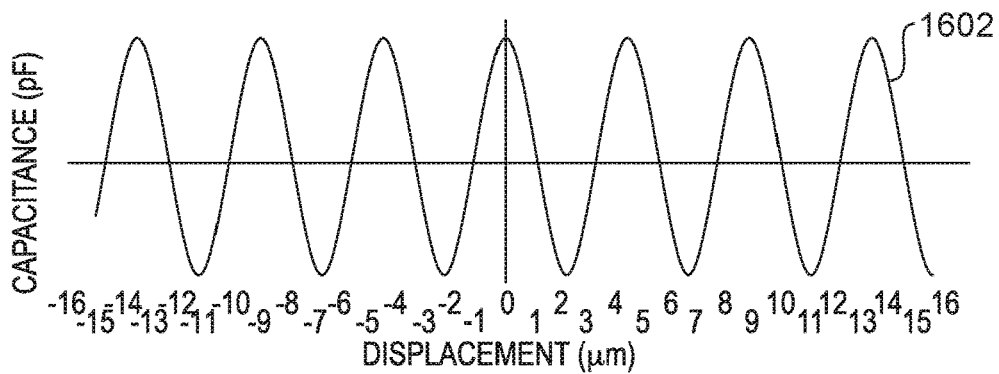
FIG. 16 is a graph depicting capacitance as a function of the displacement of the sense mass of the composite mass inertial accelerometer, according to an illustrative implementation.

FIG. 16 is a graph depicting the capacitance as a function of the displacement of the sense mass of the composite mass accelerometer, according to an illustrative implementation. FIG. 16 includes a capacitance curve 1602 that is periodic and substantially sinusoidal. Thus, monotonic motion of the movable element, such as described with reference to FIG. 6 and FIG. 9, produces a capacitance that changes non-monotonically with displacement. This non-monotonic change is a function of the geometric structure of the TDS structures shown with reference to FIG. 6 and FIG. 9, and the manner in which the composite mass accelerometer is excited.

Figure 17:
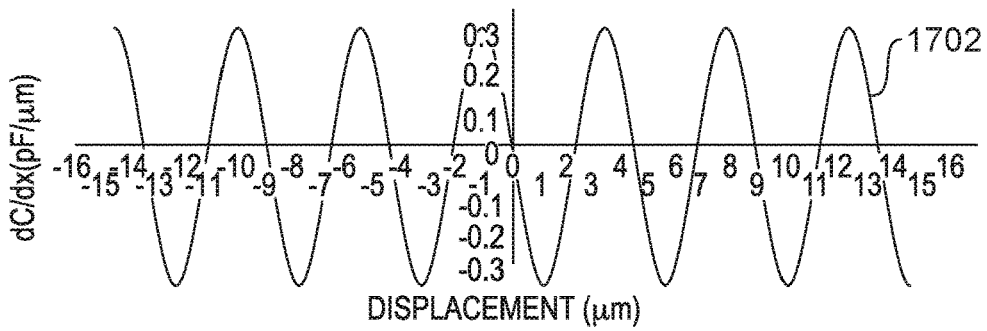
FIG. 17 is a graph depicting the first spatial derivative of capacitance as a function of the displacement of the sense mass of the composite mass accelerometer, according to an illustrative implementation.

FIG. 17 is a graph depicting the first spatial derivative of capacitance as a function of the displacement of the sense mass of the composite mass inertial accelerometer, according to an illustrative implementation. FIG. 17 includes a dC/dx curve 1702 which is periodic and substantially sinusoidal. The dC/dx curve 1702 is the first derivative of the capacitance curve 1602. As such, the dC/dx curve 1702 crosses zero when the capacitance curve 1602 experiences a local extremum. Capacitive current is proportional to the first derivative of capacitance and thus proportional to, and shares zero-crossings with, the dC/dx curve 1702.

Figure 18:
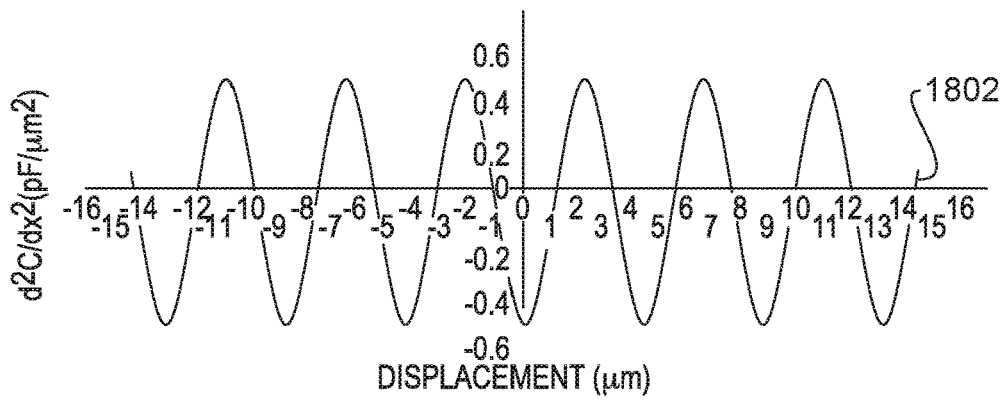
FIG. 18 is a graph depicting the second spatial derivative of capacitance as a function of the displacement of the sense mass of a composite mass accelerometer, according to an illustrative implementation.

FIG. 18 is a graph depicting the second spatial derivative of capacitance as a function of the displacement of the sense mass of the composite mass accelerometer, according to an illustrative implementation. FIG. 18 includes a $d^2C/dx^2$ curve 1802. The $d^2C/dx^2$ curve 1802 is the first derivative of the dC/dx curve 1702 and as such has a value of zero at local extrema of the dC/dx curve 1702. The $d^2C/dx^2$ curve 1802 indicates the slope of the dC/dx curve 1702 and thus indicates locations at which the current is most rapidly changing. In some implementations, it is desirable to maximize the amplitude of the $d^2C/dx$ curve 1802 to maximize the steepness of the current curve. This reduces uncertainty in resolving timing of zero-crossings of the current. Reducing uncertainty of the zero-crossing times results in decreased system noise and decreased jitter, as well as, lower gain required of the system. Decreased jitter results in improved resolution of external perturbations. In some implementations, it is desirable to minimize the impact of variable parasitic capacitance, which is parasitic capacitance that varies with oscillator motion.

Figure 19:
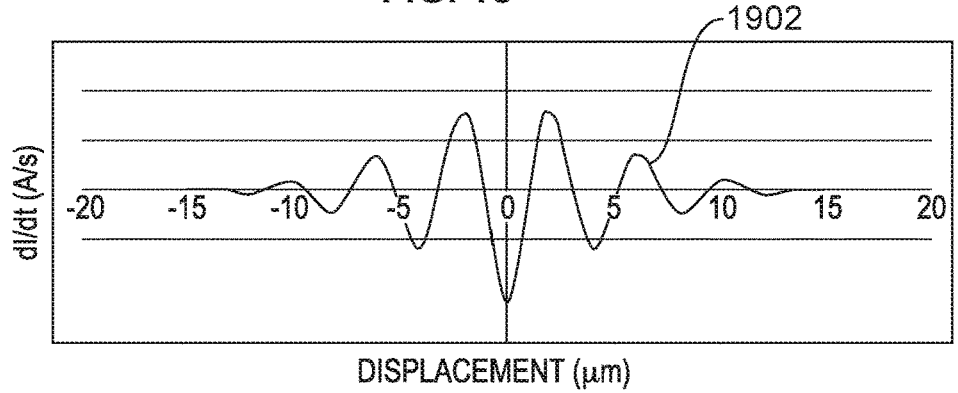
FIG. 19 is a graph depicting the time derivative of the capacitive current as a function of displacement, according to an illustrative implementation.

FIG. 19 is a graph depicting the time derivative of the capacitive current as a function of displacement, according to an illustrative implementation. FIG. 19 includes a dI/dt curve 1902. The capacitive current used to determine the dI/dt curve 1902 is obtained by applying a fixed voltage across the capacitor used to produce the capacitive curve 1602. The dI/dt curve 1902 represents the rate at which the capacitive current is changing with time and thus provides an indicator of the steepness of the current slope. High magnitudes of the dI/dt signal indicate rapidly changing current and high current slopes. Since the oscillator used to generate the curves shown in FIGS. 16-19 oscillates about zero displacement and reverses direction at displacements of +15 μm and −15 μm, the velocity of the oscillator is lowest at its extrema of displacement. At these displacement extrema, the current is also changing less rapidly and thus the dI/dt curve 1902 has a lower magnitude. Using zero-crossings at which the dI/dt curve 1902 has large values results in improved timing resolution and decreased jitter. These zero-crossings occur near the center of the oscillator's range.

Figure 20:
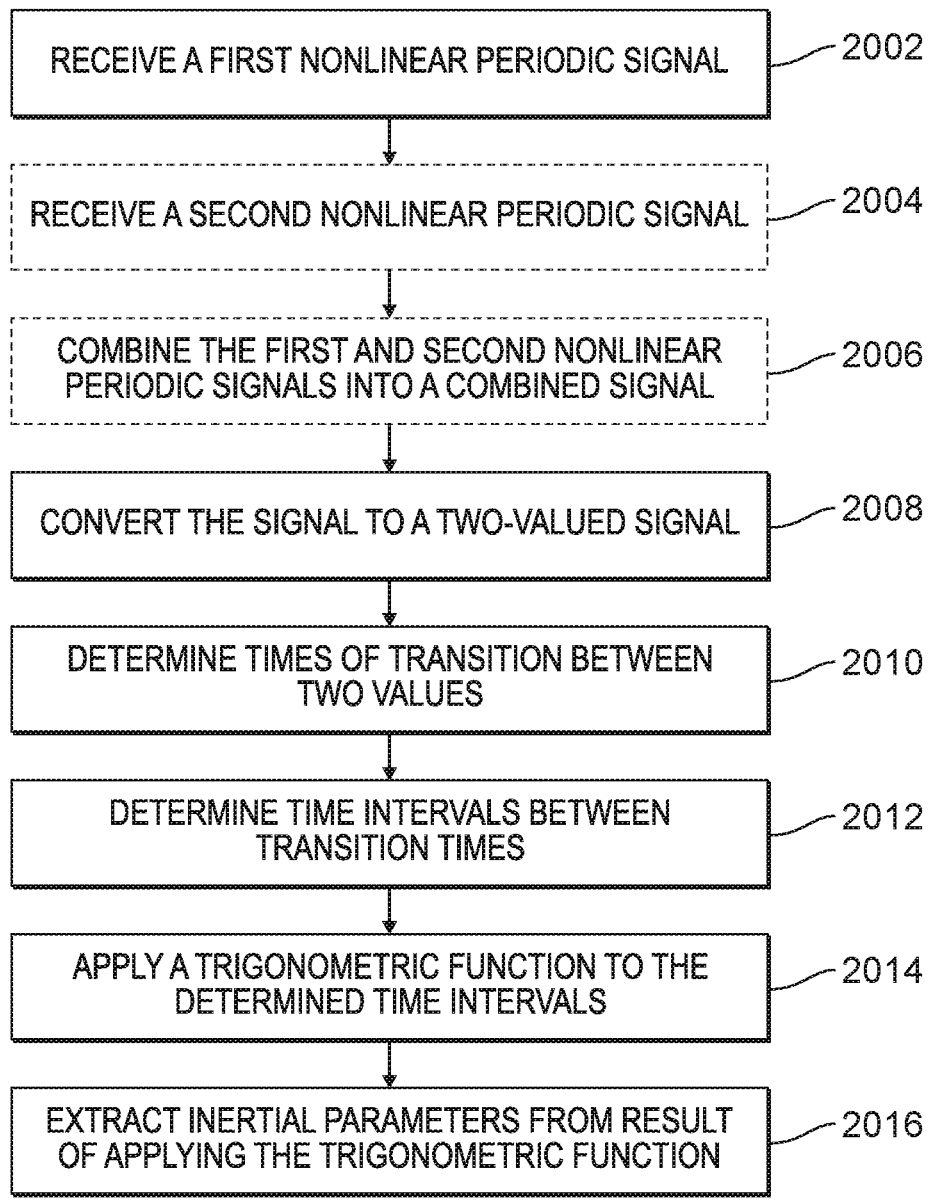
FIG. 20 depicts a flow chart of a method for extracting inertial parameters from a nonlinear periodic signal, according to an illustrative implementation.

FIG. 20 depicts a flow chart of a method for extracting inertial parameters from a nonlinear periodic signal, according to an illustrative implementation. At 2002, a first nonlinear periodic signal is received. At 2004, a second nonlinear periodic signal is optionally received. The first nonlinear periodic signal and the optional second nonlinear periodic signal can be generated by any of the TDS structures depicted herein and received at signal processing circuitry configured to extract an inertial parameter from one or more nonlinear periodic signals.

At 2006, optionally, the first and second nonlinear periodic signals are combined into a combined signal. This can be accomplished by the element 1006 as depicted in FIG. 10. If the steps 2004 and 2006 are omitted, the method 2000 proceeds from 2002 directly to 2008.

At 2008, the signal is converted to a two-valued signal by signal processing circuitry that can include a comparator and/or a high-gain amplifier. The two-valued signal can be a signal that has substantially only two values, but may transition quickly between the two values. This two-valued signal can be a digital signal such as that output from a digital circuit element. In some examples, the two-valued signal is produced by amplifying the combined signal or one of the first and second nonlinear signals using a high-gain amplifier. This technique can be referred to as "amplifying to the rails." The two-valued signal can be the signal 1012 as depicted in FIG. 10. The two-valued signal can be determined based on a threshold such that if the combined, first, or second signal is above the threshold, the two-valued signal takes on a first value and if below the threshold, the two-valued signal takes on a second value.

At 2010, times of transitions between the two values of the two-valued signal are determined. In some examples, these times can be determined using a time-to-digital converter (TDC) or by an analog to digital converter and digital signal processing. The time intervals determined in this way can be one or more of the intervals 1532, 1534, 1540, and 1542 shown in FIG. 15.

At 2014, a trigonometric function is applied to the determined time intervals. The trigonometric function can be a sine function, a cosine function, a tangent function, a cotangent function, a secant function, and a cosecant function. The trigonometric function can also be one or more of the inverse trigonometric functions such as the arcsine, the arccosine, the arctangent, the arccotangent, the arcsecant, and the arccosecant functions. Applying the trigonometric function can include applying a trigonometric function to an argument that is based on the determined time intervals.

At 2016, inertial parameters are extracted from the result of applying the trigonometric function. Extracting the inertial parameters can include curve fitting and computing derivatives of the result. The inertial parameters can be one or more of sensor acceleration, sensor velocity, sensor displacement, sensor rotation rate, sensor rotational acceleration and higher order derivatives of linear or rotational acceleration, such as jerk, snap, crackle, and pop.

Figure 21:
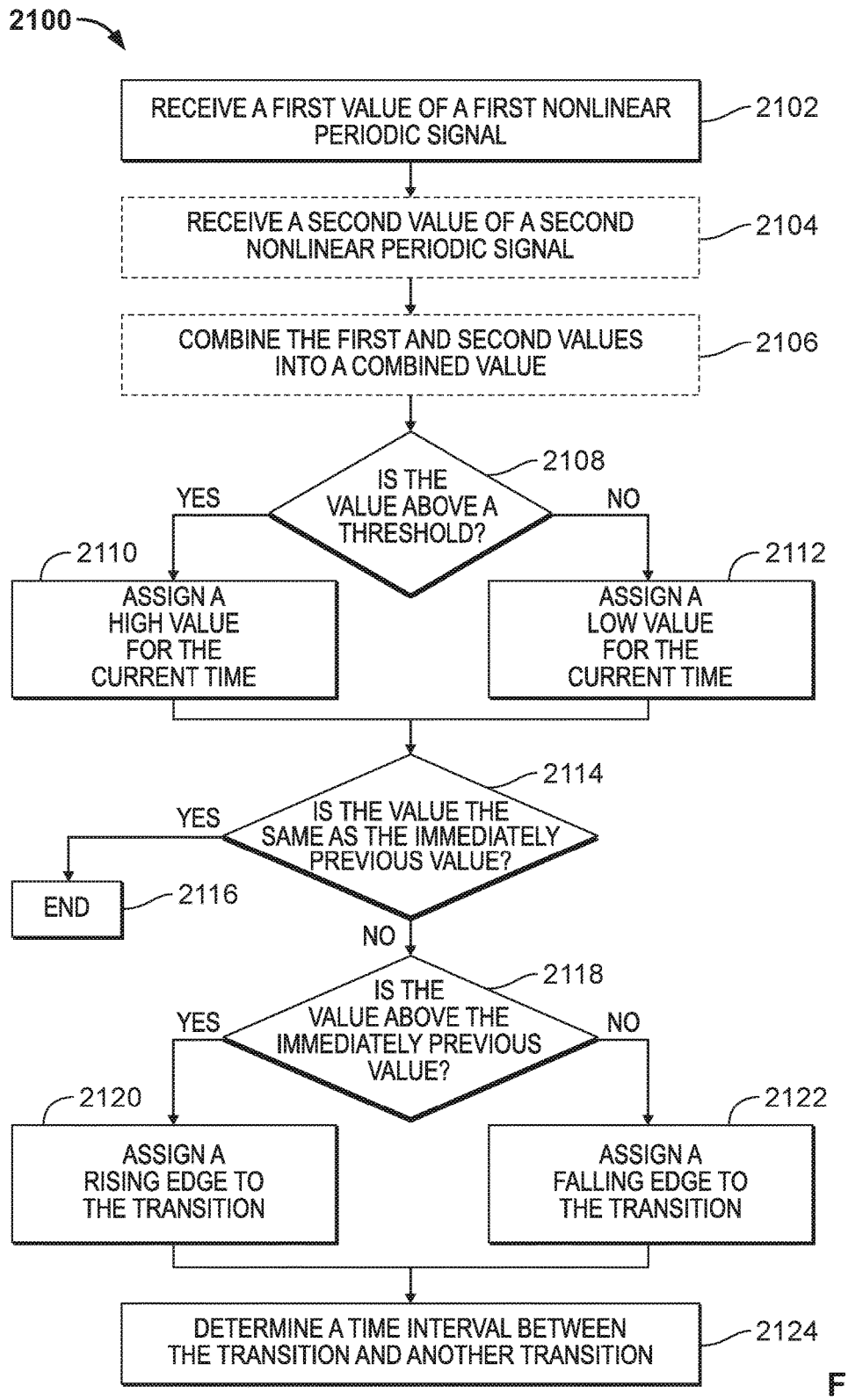
FIG. 21 depicts a flow chart of a method for determining transition times between two values based on a nonlinear periodic signal, according to an illustrative implementation.

FIG. 21 depicts a flow chart of a method for determining transition times between two values based on a nonlinear periodic signal, according to an illustrative implementation. The method 2100 can be used to perform one or more of the steps 2002, 2004, 2006, 2008, and 2010 of the method 2000.

At 2102, a first value of a first nonlinear periodic signal is received at signal processing circuitry that can include a TDC or digital circuitry. At 2104, a second value of a second nonlinear periodic signal is optionally received at the TDC or digital circuitry. The first and second values are values of the first and second signals at particular moments in time, and can be analog or digital values. The first and second nonlinear periodic signals of the method 2100 can be the same as the first and second nonlinear periodic signals of the method 2000.

At 2106, the first and second values are optionally combined into a combined value. The values may be combined using the element 1006 shown in FIG. 10, which may include a summing amplifier, a differential amplifier, an analog multiplier, and/or an analog divider. Combining may include summing the values, taking a difference of the values, multiplying the values, or dividing the values. If the optional steps 2104 and 2106 are omitted, the method 2100 proceeds from 2102 directly to 2108.

At 2108, the first value or the combined value is compared to a threshold. If the value is above the threshold, the method 2100 proceeds to 2110.

At 2110, a high value is assigned for the current time. If the value is not above the threshold, the method 2100 proceeds to 2112. At 2112, a low value is assigned for the current time. The steps 2108, 2110 and 2112 can be used to generate a two-valued signal having high and low values from an input signal. The two-valued signal of the method 2100 can be the same as the signal of the method 2000.

At 2114, the value of the signal for the current time is compared to a value of the signal for an immediately previous time. If the two values are the same, the method 2100 proceeds to 2116 where the method 2100 terminates. If the two values are not the same, a transition has occurred and the method proceeds to 2118.

At 2118, the sense of the transition (whether the transition is a rising edge or a falling edge) is determined. If the value for the current time is greater than the value for the previous time, a rising edge is assigned to the transition.

If the value for the current time is not above the value for the previous time, the method 2100 proceeds to 2122. At 2122, a falling edge is assigned to the transition. Thus, times having transitions are detected and classified as having either rising or falling edges. At 2124, a time interval is determined between the transition and another transition. Time intervals between these transition times can be determined by obtaining a difference in time values between times of transition.

Figure 22:
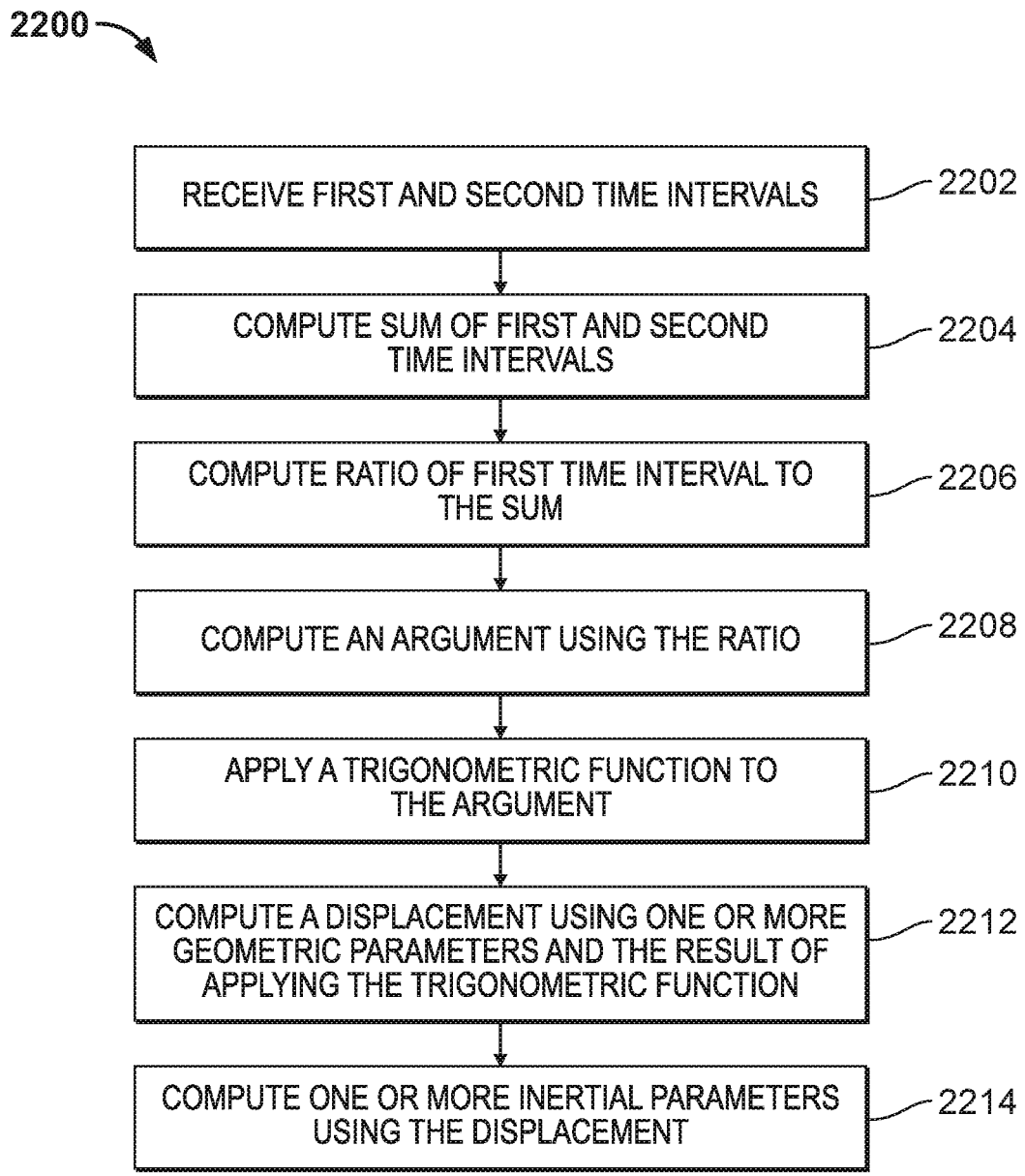
FIG. 22 depicts a flow chart of a method for computing inertial parameters from time intervals, according to an illustrative implementation.

FIG. 22 depicts a flow chart of a method for computing inertial parameters from time intervals, according to an illustrative implementation. At 2202, first and second time intervals are received at signal processing circuitry that can include a TDC or digital circuitry. The first and second time intervals can be determined using the method 2100 depicted in FIG. 21.

At 2204, a sum of the first and second time intervals is computed using digital signal processing circuitry such as an application specific integrated circuit (ASIC) or a field programmable gate array (FPGA). The sum can be the measured period as described by equations (7) and (8). At 2206, a ratio of the first time interval to the sum is computed. The ratio can be one or more of the ratios forming part of the arguments of the cosine functions in equation (6).

At 2208, an argument is computed using the ratio by the digital signal processing circuitry. The argument can be one or more of the arguments of the cosine functions of equation (6).

At 2210, a trigonometric function is applied to the argument by the digital signal processing circuitry. The trigonometric function can be any of the trigonometric functions described with reference to step 2104 of the method 2100.

At 2212, the digital signal processing circuitry computes a displacement using one or more geometric parameters and using the result of applying the trigonometric function. The displacement can be computed using equation (6). Computing displacement can involve computing more than one trigonometric function, and arguments other than the computed argument of 2208 can be included as arguments of some of the trigonometric functions.

At 2214, the digital signal processing circuitry computes one or more inertial parameters using the displacement. The inertial parameters computed can be any of the inertial parameters described with reference to step 2016 of the method 2000. Inertial parameters can be computed by obtaining one or more derivatives of the displacement with respect to time. Inertial parameters may be extracted using an offset of the computed displacement to determine an external acceleration. In this way, inertial parameters are computed from time intervals.

The systems described herein can be fabricated using MEMS and microelectronics fabrication processes such as lithography, deposition, and etching. The features of the MEMS structure are patterned with lithography and selected portions are removed through etching. Such etching can include deep reactive ion etching (DRIE) and wet etching. In some examples, one or more intermediate metal, semiconducting, and/or insulating layers are deposited. The base wafer can be a doped semiconductor such as silicon. In some examples, ion implantation can be used to increase doping levels in regions defined by lithography. The spring systems can be defined in a substrate silicon wafer, which is then bonded to top and bottom cap wafers, also made of silicon. Encasing the spring systems in this manner allows the volume surrounding the mass to be evacuated. In some examples, a getter material such as titanium is deposited within the evacuated volume to maintain a low pressure throughout the lifetime of the device. This low pressure enhances the quality factor of the resonator. From the MEMS structure, conducting traces are deposited using metal deposition techniques such as sputtering or physical vapor deposition (PVD). These conducting traces electrically connect active areas of the MEMS structure to microelectronic circuits. Similar conducting traces can be used to electrically connect the microelectronic circuits to each other. The fabricated MEMS and microelectronic structures can be packaged using semiconductor packaging techniques including wire bonding and flip-chip packaging.

As used herein, the term "memory" includes any type of integrated circuit or other storage device adapted for storing digital data including, without limitation, ROM, PROM, EEPROM, DRAM, SDRAM, DDR/2 SDRAM, EDO/FPMS, RLDRAM, SRAM, flash memory (e.g., AND/NOR, NAND), memrister memory, and PSRAM.

As used herein, the term "processor" is meant generally to include all types of digital processing devices including, without limitation, digital signal processors (DSPs), reduced instruction set computers (RISC), general-purpose (CISC) processors, microprocessors, gate arrays (e.g., FPGAs), PLDs, reconfigurable compute fabrics (RCFs), array processors, secure microprocessors, and ASICs. Such digital processors may be contained on a single unitary integrated circuit die, or distributed across multiple components.

From the above description of the system it is manifest that various techniques may be used for implementing the concepts of the system without departing from its scope. In some examples, any of the circuits described herein may be implemented as a printed circuit with no moving parts. Further, various features of the system may be implemented as software routines or instructions to be executed on a processing device (e.g. a general purpose processor, an ASIC, an FPGA, etc.) The described embodiments are to be considered in all respects as illustrative and not restrictive. It should also be understood that the system is not limited to the particular examples described herein, but can be implemented in other examples without departing from the scope of the claims.

Similarly, while operations are depicted in the drawings in a particular order, this should not be understood as requiring that such operations be performed in the particular order shown or in sequential order, or that all illustrated operations be performed, to achieve desirable results.

What is claimed is:

1. A composite mass system, comprising:
   a sense mass, wherein the sense mass responds to an inertial parameter in a first direction at a first frequency in the first direction;
   a drive mass flexibly coupled to the sense mass, wherein the drive mass is driven in the first direction at a second frequency;
   a first time-domain switch configured to generate an output voltage based on a first current generated in part by the sense mass moving relative to a support structure; and
   logic circuitry in signal communication with the first time-domain switch and configured to:
   determine a time interval based on the output voltage; and
   calculate the inertial parameter based on the time interval.

2. The composite mass system of claim 1, wherein a resonant frequency of the sense mass is different from a resonant frequency of the drive mass.

3. The composite mass system of claim 2, wherein the first frequency is the resonant frequency of the sense mass, and the second frequency is the resonant frequency of the drive mass.

4. The composite mass system of claim 1, wherein the drive mass is flexibly coupled to the sense mass via coupling springs that are compliant in the first direction.

5. The composite mass system of claim 4, further comprising an anchor structure rigidly coupled to the support structure, wherein the drive mass is mechanically coupled to the anchor structure via drive springs.

6. The composite mass system of claim 5, wherein a spring constant of the coupling springs is lower than a spring constant of the drive springs.

7. The composite mass system of claim 5, further comprising an arm having a major axis that passes radially from the anchor structure to the drive mass, wherein the drive springs are coupled to the arm and configured to cause the drive mass to move substantially in the first direction as the arm is rotated about an axis perpendicular to a plane defined by the first direction and the major axis.

8. The composite mass system of claim 7, wherein the first direction is substantially tangential to the rotation of the arm.

9. The composite mass system of claim 5, wherein a spring constant of the coupling springs increases as oscillation frequency increases and decreases as oscillation frequency decreases.

10. The composite mass system of claim 1, wherein the drive mass is driven via a comb drive.

11. The composite mass system of claim 1, wherein the time-domain switch comprises a first half coupled to the sense mass and a second half coupled to the support structure.

12. The composite mass system of claim 1, wherein the time-domain switch comprises a plurality of time-domain switches.

13. The composite mass system of claim 1, further comprising a second time-domain switch configured to generate a second voltage based on a second current generated in part by the sense mass, wherein the first current is out of phase with the second current.

14. The composite mass system of claim 13, wherein the logic circuitry is further configured to linearly combine a signal generated from the first time-domain switch with a signal generated from the second time-domain switch.

15. The composite mass system of claim 1, wherein the second frequency is higher than the first frequency.

16. The composite mass system of claim 15, wherein the inertial parameter is acceleration.

17. A method for determining an inertial parameter, comprising:
    responding to an inertial parameter in a first direction with a sense mass in the first direction at a first frequency;
    driving, in the first direction at a second frequency, a drive mass that is flexibly coupled to the sense mass;
    generating, from a first time-domain switch, an output voltage based on a first current generated in part by the sense mass moving relative to a support structure;
    determining a time interval based on the output voltage; and
    calculating the inertial parameter based on the time interval.

18. The method of claim 17, further comprising oscillating the sense mass at a resonant frequency of the sense mass and driving the drive mass at a resonant frequency of the drive mass.

19. The method of claim 17, wherein the drive mass is flexibly coupled to the sense mass via coupling springs that are compliant in the first direction.

20. The method of claim 19, wherein the drive mass is mechanically coupled to an anchor structure via drive springs; and
    wherein the anchor structure is rigidly coupled to the support structure.

21. The method of claim 20, wherein a spring constant of the coupling springs is lower than a spring constant of the drive springs.

22. The method of claim 17, wherein the drive mass is driven via a comb drive.

23. The method of claim 17, wherein a first half of the time-domain switch is coupled to the sense mass and a second half of the time-domain switch is coupled to the support structure.

24. The method of claim 23, further comprising generating, from a second time-domain switch, a second voltage based on a second current generated in part by the sense mass, wherein the first current is out of phase with the second current.

25. The method of claim 24, further comprising linearly combining a signal generated from the first time-domain switch with a signal generated from the second time-domain switch.

26. The method of claim 17, wherein a resonant frequency of the sense mass is different from a resonant frequency of the drive mass.

27. The method of claim 17, wherein the inertial parameter comprises an acceleration.

* * * * *